US012787230B2

(12) United States Patent
Masuyama et al.

(10) Patent No.: US 12,787,230 B2
(45) Date of Patent: Nov. 3, 2026

(54) ELECTRONIC DEVICE

(71) Applicant: Mitsubishi Electric Corporation, Tokyo (JP)

(72) Inventors: Takahiro Masuyama, Tokyo (JP); Hirokazu Takabayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 235 days.

(21) Appl. No.: 18/715,492

(22) PCT Filed: Jan. 26, 2022

(86) PCT No.: PCT/JP2022/002830

§ 371 (c)(1),
(2) Date: May 31, 2024

(87) PCT Pub. No.: WO2023/144914

PCT Pub. Date: Aug. 3, 2023

(65) Prior Publication Data

US 2025/0040103 A1 Jan. 30, 2025

(51) Int. Cl.
*H05K 7/20* (2006.01)
*H05K 5/02* (2006.01)
*H05K 5/03* (2006.01)

(52) U.S. Cl.
CPC ....... *H05K 7/20854* (2013.01); *H05K 5/0213* (2013.01); *H05K 5/03* (2013.01)

(58) Field of Classification Search
CPC ..... H05K 7/20854; H05K 5/0213; H05K 5/03
(Continued)

(56) References Cited

U.S. PATENT DOCUMENTS 6,431,081 B2 * 8/2002 Mary ...................... B61C 17/04 191/4
8,151,955 B2 * 4/2012 Aubigny .............. G01R 15/142 191/2

(Continued)

FOREIGN PATENT DOCUMENTS

JP 2009124038 A 6/2009
WO WO-2021199252 A1 * 10/2021 ......... H05K 7/20936

OTHER PUBLICATIONS

International Search Report (PCT/ISA/210) with translation and Written Opinion (PCT/ISA/237) mailed on Apr. 19, 2022, by the Japan Patent Office as the International Searching Authority for International Application No. PCT/JP2022/002830. (8 pages).

*Primary Examiner* — Anatoly Vortman
(74) *Attorney, Agent, or Firm* — Buchanan Ingersoll & Rooney PC

(57) ABSTRACT

An electric device includes a heat-receiving block, a heat transfer member, multiple fins, and a cover. The cover includes a side wall extending in a direction surrounding a normal line to a second main surface of the heat-receiving block and a lid attached to the side wall with the heat transfer member located between the lid and the heat-receiving block. The cover accommodates the heat transfer member and the fins in a space surrounded by the side wall and the lid. The cover has a vent in at least an outer surface of the side wall intersecting with a travel direction of a vehicle. A ratio of an open area of the vent to an area of the outer surface of the side wall is higher than a ratio of an open area of a vent to an area of an outer surface of the lid.

7 Claims, 32 Drawing Sheets

(58) Field of Classification Search
USPC .......................................................... 361/704
See application file for complete search history.

(56) References Cited

U.S. PATENT DOCUMENTS

| | | | | |
|---|---|---|---|---|
| 8,176,854 | B2 * | 5/2012 | Smith, Jr. | B61D 17/16 52/45 |
| 10,906,405 | B2 * | 2/2021 | Uehara | B61C 3/00 |
| 12,250,796 | B2 * | 3/2025 | Takabayashi | H02M 7/003 |
| 2015/0016171 | A1 * | 1/2015 | Yasuda | H05K 7/209 363/141 |
| 2023/0073236 | A1 * | 3/2023 | Takabayashi | H02M 7/003 |
| 2024/0206132 | A1 * | 6/2024 | Masuyama | H05K 7/20854 |
| 2024/0306349 | A1 * | 9/2024 | Takabayashi | F28D 1/0233 |
| 2025/0040103 | A1 * | 1/2025 | Masuyama | H05K 7/20854 |

* cited by examiner

ELECTRONIC DEVICE

TECHNICAL FIELD

The present disclosure relates to an electronic device.

BACKGROUND ART

An electronic device, such as a power converter, installed on a railway vehicle dissipates, through a cooler, heat generated by electronic components into, for example, passing air created by the traveling vehicle or cooling air supplied from a fan to cool the electronic components. An example of such an electronic device is described in Patent Literature 1. Patent Literature 1 describes a power converter attached to the roof of a railway vehicle. The power converter includes fins attached to the upper surface and the side surfaces of a housing. The power converter described in Patent Literature 1 dissipates heat through heat transfer from the fins into air flowing along the fins and thermal radiation from the fins to cool electronic components including semiconductor devices accommodated in the housing of the power converter.

CITATION LIST

Patent Literature

Patent Literature 1: Unexamined Japanese Patent Application Publication No. 2009-124038

SUMMARY OF INVENTION

Technical Problem

In sunny weather, the fins are exposed to sunlight that reduces thermal radiation from the fins, lowering the cooling performance of the electronic device. An electronic device including a cover for the fins has vents across the cover surface for airflow. The fins are thus exposed, through the vents, to sunlight that reduces thermal radiation, lowering the cooling performance of the electronic device.

Under such circumstances, an objective of the present disclosure is to provide an electronic device that can cool electronic components also in sunny weather.

Solution to Problem

To achieve the above objective, an electronic device according to an aspect of the present disclosure is installable on a roof of a vehicle. The electric device includes a heat-receiving block being heat conductive, a heat transfer member, a plurality of fins, and a cover. The heat-receiving block has a first main surface to which an electronic component is attached. The heat transfer member is attached to the heat-receiving block. The heat transfer member extends away from a second main surface of the heat-receiving block located opposite to the first main surface of the heat-receiving block and facing vertically upward. The heat transfer member transfers heat transferred from the electronic component through the heat-receiving block away from the second main surface. The plurality of fins is attached to the heat transfer member and dissipate heat transferred from the electronic component through the heat-receiving block and the heat transfer member into ambient air. The plurality of fins is arranged in at least one of a width direction of the vehicle or a travel direction of the vehicle with spaces between the plurality of fins. The cover includes a side wall and a lid. The side wall extends in a direction surrounding a normal line to the second main surface. The lid is attached to the side wall with the heat transfer member located between the lid and the heat-receiving block. The cover accommodates the heat transfer member and the plurality of fins in a space surrounded by the side wall and the lid. The cover has a vent in at least an outer surface of the side wall intersecting with the travel direction of the vehicle. A ratio of an open area of the vent on the side wall to an area of the outer surface of the side wall is higher than a ratio of an open area of a vent on the lid to an area of an outer surface of the lid.

Advantageous Effects of Invention

The cover included in the electronic device according to the above aspect of the present disclosure has the ratio of the open area of the vent to the area of the outer surface of the side wall that is higher than the ratio of the open area of the vent to the area of the outer surface of the lid. The cover can thus reduce the amount of exposure of the fins to sunlight and lower the likelihood of reduced thermal radiation from the fins. Thus, the electronic device can cool the electronic component also in sunny weather.

DESCRIPTION OF EMBODIMENTS

Figure 1:
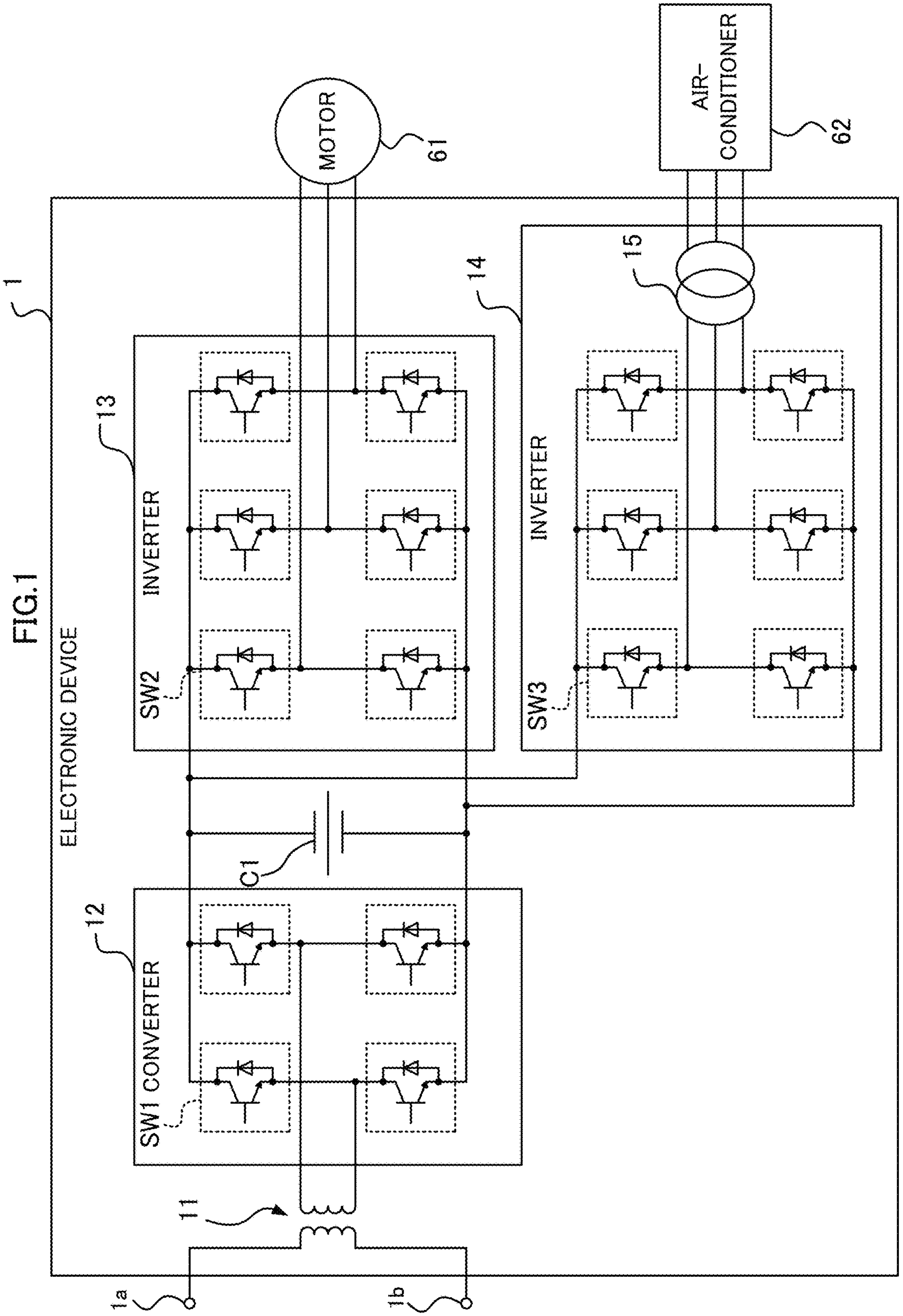
FIG. 1 is a block diagram of an electronic device according to Embodiment 1.

An electronic device according to one or more embodiments of the present disclosure is described in detail with reference to the drawings. Components identical or corresponding to each other are provided with the same reference sign in the drawings.

Embodiment 1

One example of an electronic device is a power converter installable on a railway vehicle to convert alternating current (AC) power supplied from an AC power supply to AC power to be supplied to a load and to supply the resulting AC power to the load. An electronic device 1 according to an embodiment is described using, as an example, a power converter installed on the roof of a railway vehicle to cool electronic components through natural convection and passing air that is an airflow caused by a traveling railway vehicle and flowing in a direction opposite to the travel direction of the railway vehicle.

The electronic device 1 illustrated in FIG. 1 is installed on an AC feeding railway vehicle. The electronic device 1 converts supplied AC power to AC power appropriate for a motor 61 and an air-conditioner 62 serving as example loads, and supplies the resulting AC power to the motor 61 and the air-conditioner 62. The motor 61 is, for example, a three-phase induction motor that generates propulsion of the railway vehicle. When the electronic device 1 supplies power to the motor 61 during traveling of the railway vehicle, more specifically, during power running, the motor 61 generates propulsion of the railway vehicle. The air-conditioner 62 is an air conditioner in the railway vehicle. When the electronic device 1 supplies power to the air-conditioner 62 during the operation of the railway vehicle, more specifically, during traveling or stopping of the railway vehicle, the air-conditioner 62 operates to adjust the temperature in the railway vehicle to an intended temperature.

The components of the electronic device 1 are described below. The electronic device 1 includes a terminal 1*a* connected to the power supply and a terminal 1*b* grounded. The electronic device 1 further includes a transformer 11 that lowers the voltage of AC power supplied from the power supply connected to the terminal 1*a*, a converter 12 that converts the AC power having the voltage lowered by the transformer 11 to direct current (DC) power, a capacitor C1 charged with the DC power output from the converter 12, and inverters 13 and 14 that convert the DC power input through the capacitor C1 to AC power.

The terminal 1*a* is electrically connected to, for example, a current collector that acquires AC power supplied from an electrical substation through a power line. The current collector serves as the power supply that supplies power to the electronic device 1. The power line is, for example, an overhead power line or a third rail. The current collector is a pantograph or a current collector shoe. The terminal 1*b* is short-circuited to rails through, for example, a ground brush, a ground ring, or wheels, which are not illustrated, and grounded.

The transformer 11 includes a primary winding having one end connected to the terminal 1*a* and the other end connected to the terminal 1*b*, and a secondary winding connected to the converter 12. For example, the transformer 11 lowers single-phase AC power with a voltage of 25 kV supplied from the current collector to single-phase AC power with a voltage of 1520 V, and supplies the AC power with the lowered voltage to the converter 12.

The converter 12 includes two pairs of two switching elements SW1 that are connected in series. The switching elements SW1 in one pair and the switching elements SW1 in the other pair are connected in parallel. One end of the secondary winding in the transformer 11 is connected to the connection point of the two switching elements SW1 in one pair, and the other end of the secondary winding of the transformer 11 is connected to the connection point of the two switching elements SW1 in the other pair.

Each switching element SW1 includes an insulated-gate bipolar transistor (IGBT) and a freewheeling diode having an anode connected to the emitter terminal of the IGBT and a cathode connected to the collector terminal of the IGBT. A non-illustrated controller provides a gate signal to the gate terminal of the IGBT included in each switching element SW1 included in the converter 12 to turn on or off the IGBT, or in other words, to turn on or off the switching element SW1. Each switching element SW1 performs switching to cause the converter 12 to convert AC power supplied from the transformer 11 to DC power.

The capacitor C1 is charged with DC power output from the converter 12. The capacitor C1 has one end connected to the connection point between the positive terminal of the converter 12 and the primary positive terminals of the inverters 13 and 14 and the other end connected to the connection point between the negative terminal of the converter 12 and the primary negative terminals of the inverters 13 and 14.

The inverter 13 includes three pairs of two switching elements SW2 that are connected in series. The three pairs of switching elements SW2 correspond to the U phase, the V phase, and the W phase of three-phase AC power. The switching elements SW2 corresponding to the U phase, the switching elements SW2 corresponding to the V phase, and the switching elements SW2 corresponding to the W phase are connected parallel to one another between the primary positive terminal and the primary negative terminal of the inverter 13. The connection point of the two switching elements SW2 corresponding to the U phase, the connection point of the two switching elements SW2 corresponding to the V phase, and the connection point of the two switching elements SW2 corresponding to the W phase are connected to the motor 61.

Similarly to the switching elements SW1, each switching element SW2 includes an IGBT and a freewheeling diode. The non-illustrated controller provides a gate signal to the gate terminal of the IGBT included in each switching element SW2 included in the inverter 13 to turn on or off the IGBT, or in other words, to turn on or off the switching element SW2. Each switching element SW2 performs switching to cause the inverter 13 to convert DC power to three-phase AC power and supply the three-phase AC power to the motor 61.

The inverter 14 includes three pairs of two switching elements SW3 that are connected in series. The three pairs of switching elements SW3 correspond to the U phase, the V phase, and the W phase of three-phase AC power. The switching elements SW3 corresponding to the U phase, the switching elements SW3 corresponding to the V phase, and the switching elements SW3 corresponding to the W phase are connected parallel to one another between the primary positive terminal and the primary negative terminal of the inverter 14.

Similarly to the switching elements SW1, each switching element SW3 includes an IGBT and a freewheeling diode. The non-illustrated controller provides a gate signal to the gate terminal of the IGBT included in each switching element SW3 included in the inverter 14 to turn on or off the IGBT, or in other words, to turn on or off the switching element SW3. Each switching element SW3 performs switching to cause the inverter 14 to convert DC power to three-phase AC power.

The inverter 14 further includes a transformer 15 that lowers the voltage of the three-phase AC power converted from DC power to a voltage appropriate for the air-conditioner 62. The connection point of the two switching elements SW3 corresponding to the U phase, the connection point of the two switching elements SW3 corresponding to the V phase, and the connection point of the two switching elements SW3 corresponding to the W phase are connected to the transformer 15. The three-phase AC power with the voltage lowered by the transformer 15 is supplied to the air-conditioner 62.

When the railway vehicle is traveling, the converter 12 and the inverters 13 and 14 are in operation. Thus, the switching elements SW1, SW2, and SW3 are repeatedly turned on and off, more specifically, perform switching and generate heat. When the railway vehicle is stopped, the motor 61 receives no power, but the air-conditioner 62 is to operate although the railway vehicle is stopped. Thus, when the railway vehicle is stopped, the inverter 13 is stopped, and the converter 12 and the inverter 14 are in operation. In other words, the switching elements SW2 generate no heat, whereas the switching elements SW1 and SW3 are repeatedly turned on and off and generate heat.

The electronic device 1 thus includes a structure that cools electronic components including the switching elements SW1, SW2, and SW3 with passing air when the railway vehicle is traveling and cools electronic components including the switching elements SW1 and SW3 through natural convection when the railway vehicle is stopped. The electronic device 1 further includes a structure that lowers the likelihood of reduced radiation from the fins resulting from exposure to sunlight in sunny weather both when the railway vehicle is traveling and when the railway vehicle is stopped.

Figure 2:
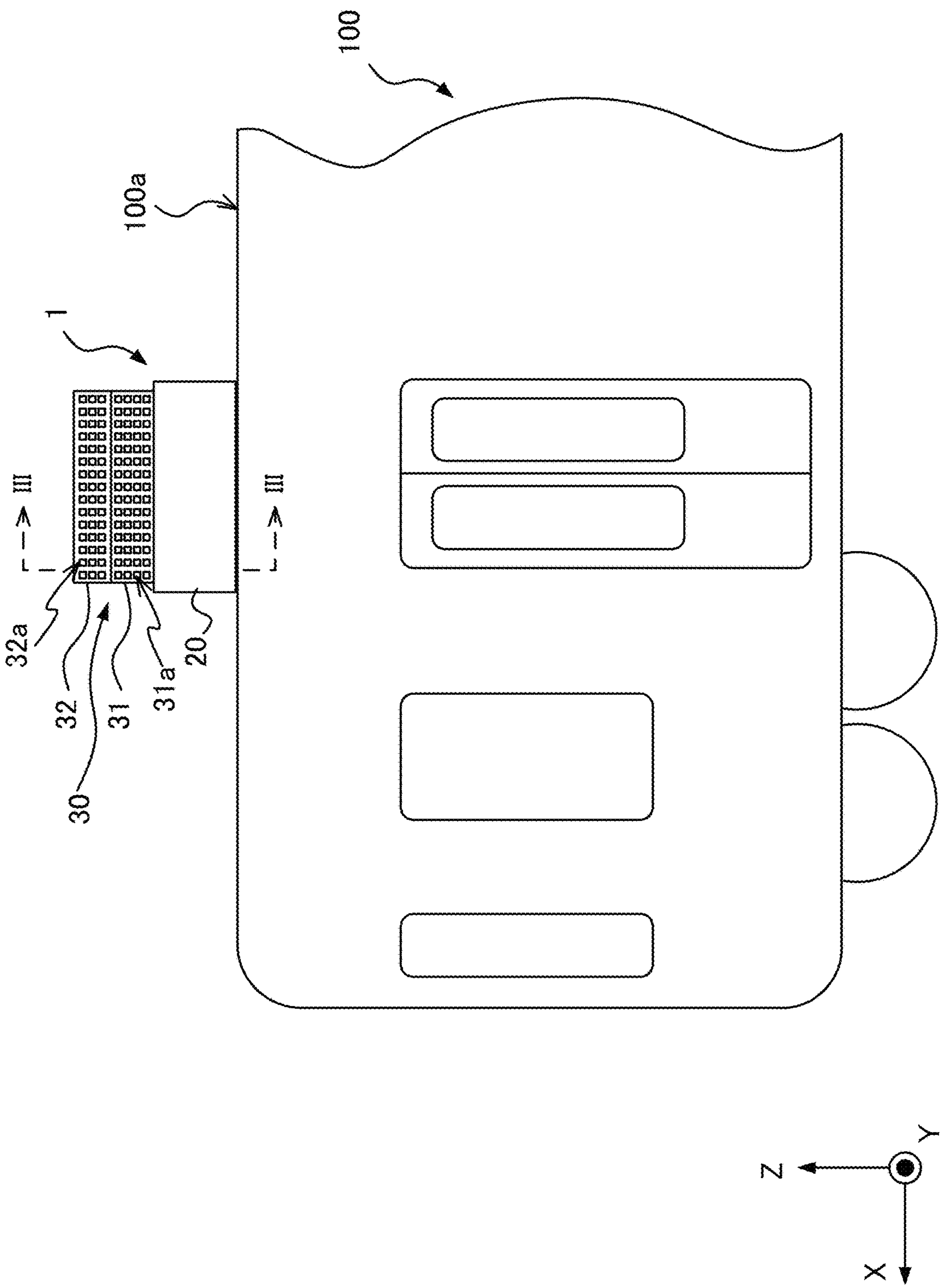
FIG. 2 is a diagram of the electronic device according to Embodiment 1, mounted on a vehicle in an example manner.
Figure 3:
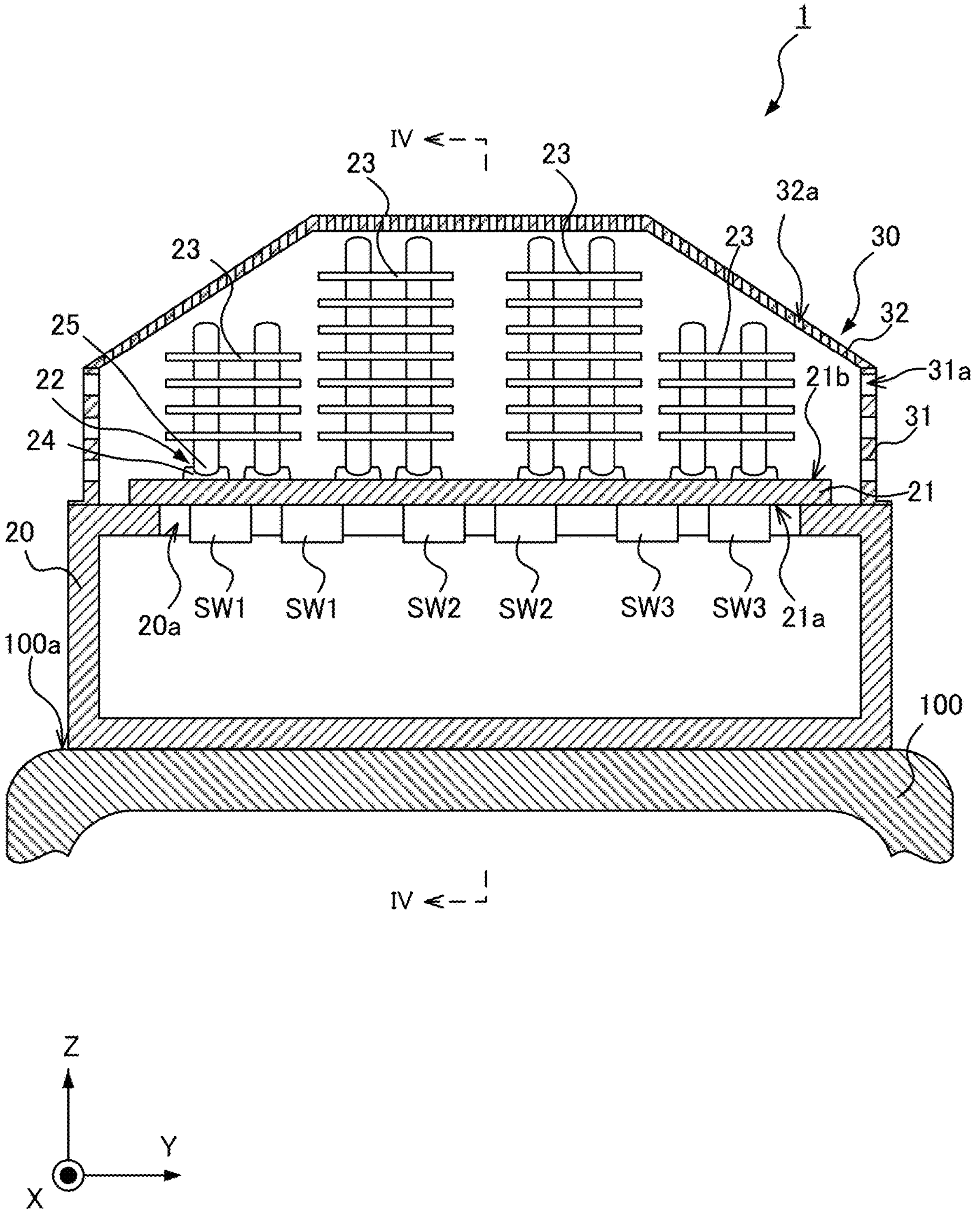
FIG. 3 is a cross-sectional view of the electronic device according to Embodiment 1 taken along line III-III in FIG. 2 as viewed in the direction indicated by the arrows.

The structure of the electronic device 1 is described in detail below. As illustrated in FIG. 2, the electronic device 1 is installed on a roof 100*a* of a vehicle 100. As illustrated in FIG. 3 that is a cross-sectional view taken along line III-III in FIG. 2 as viewed in the direction indicated by the arrows, the electronic device 1 includes a heat conductive heat-receiving block 21 having a first main surface 21*a* to which the electronic components are attached, and heat transfer members 22 attached to a second main surface 21*b* of the heat-receiving block 21 facing vertically upward, more specifically, in the positive Z-direction, to transfer heat transferred from the electronic components through the heat-receiving block 21 away from the second main surface 21*b*. The electronic device 1 further includes multiple fins 23 attached to the heat transfer members 22. The fins 23 dissipate heat transferred from the electronic components through the heat-receiving block 21 and the heat transfer members 22 into ambient air.

Preferably, the electronic device 1 further include a housing 20 installed on the roof 100*a* and accommodating electronic components including the switching elements SW1, SW2, and SW3. In this case, the heat-receiving block 21 may be attached to the housing 20 to close an opening 20*a* of the housing 20. To suppress breakage of the heat transfer members 22 and the fins 23, the electronic device 1 includes a cover 30 attached to the housing 20 to cover the heat transfer members 22 and the fins 23.

In FIGS. 2 and 3, Z-axis indicates a vertical direction for the vehicle 100 located horizontally. X-axis indicates a travel direction of the vehicle 100. Y-axis indicates a width direction of the vehicle 100. X-axis, Y-axis, and Z-axis are perpendicular to one another. The same applies to the subsequent figures.

The housing 20 is attached to a vertically upper portion of the roof 100*a*. The housing 20 is rigid and strong enough to resist deformation under the maximum expected vibration from the railway vehicle. For example, the housing 20 is formed of metal such as iron or aluminum. The housing 20 has the opening 20*a* in a vertically upper portion.

The heat-receiving block 21 is attached to the housing 20 to close the opening 20*a*. In the embodiment, the heat-receiving block 21 is a plate formed of a highly thermally conductive material including metal such as iron or aluminum, and is attached to the outer surface of the housing 20 to close the opening 20*a*. Electronic components that generate heat, more specifically, the switching elements SW1, SW2, and SW3, are attached to the first main surface 21*a* of the heat-receiving block 21. The heat transfer members 22 are attached to the second main surface 21*b* opposite to the first main surface 21*a* and facing vertically upward. For the vehicle 100 located horizontally, the first main surface 21*a* and the second main surface 21*b* extend horizontally.

Each heat transfer member 22 extends away from the second main surface 21*b* and transfers heat transferred from the electronic components through the heat-receiving block 21 away from the second main surface 21*b*. In the embodiment, each heat transfer member 22 includes a heat pipe that contains a coolant. More specifically, each heat transfer member 22 serving as a heat pipe includes a header 24 attached to the heat-receiving block 21 and a branch pipe 25 attached to the header 24 and continuous with the header 24. The header 24 and the branch pipe 25 contain a coolant in vapor and liquid phases at ambient temperature. An example of the coolant is water. In Embodiment 1, the headers 24 and the branch pipes 25 are symmetrically arranged with respect to an XZ plane.

Figure 4:
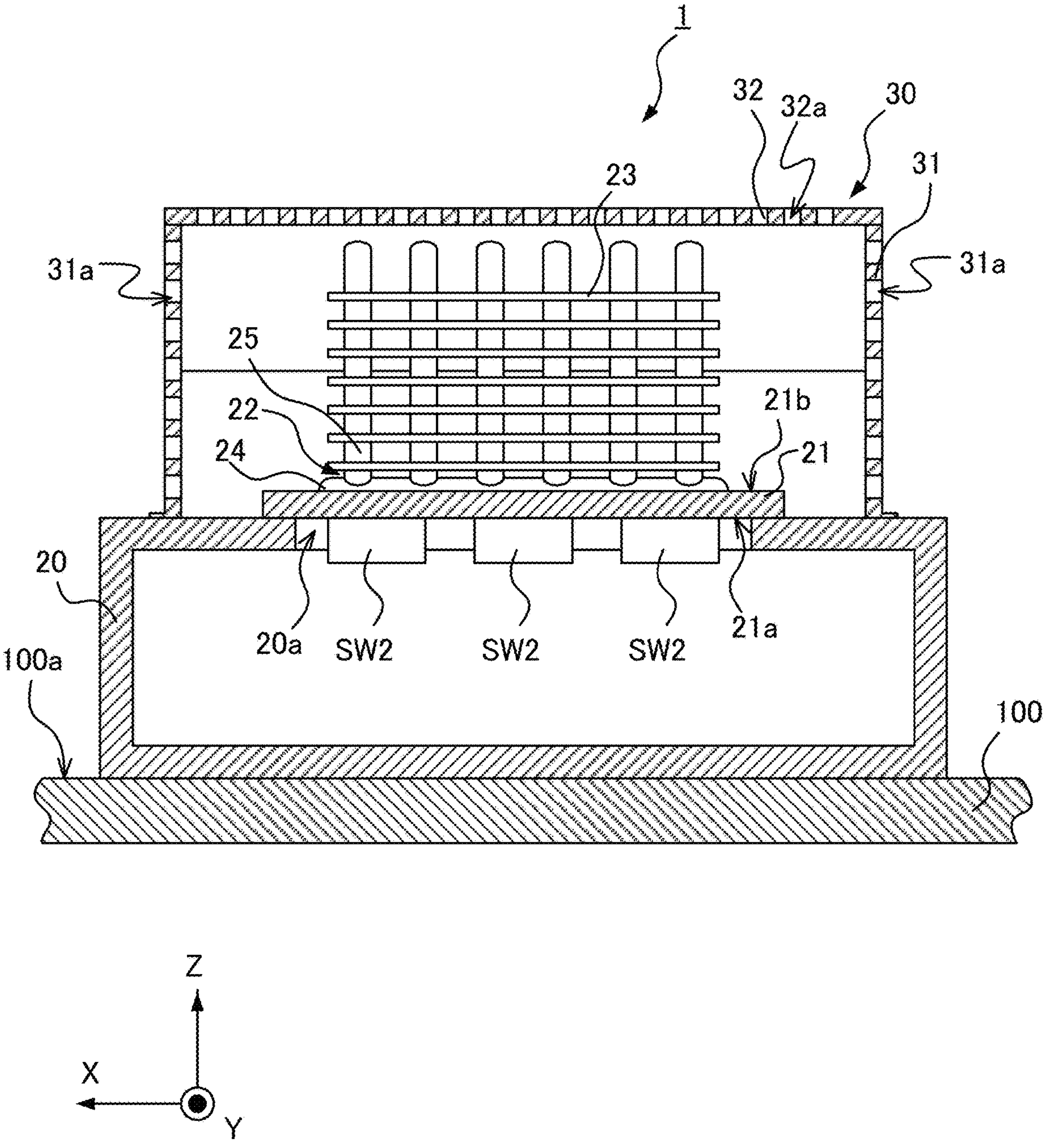
FIG. 4 is a cross-sectional view of the electronic device according to Embodiment 1 taken along line IV-IV in FIG. 3 as viewed in the direction indicated by the arrows.

As illustrated in FIG. 3 and FIG. 4 that is a cross-sectional view taken along line IV-IV in FIG. 3 as viewed in the direction indicated by the arrows, multiple headers 24 extending in X-direction are arranged in Y-direction. Each header 24 is received in a groove on the second main surface 21*b* of the heat-receiving block 21, and attached to the heat-receiving block 21 by, for example, bonding with an adhesive, welding, brazing, or soldering. Each header 24 is a pipe formed of a highly thermally conductive material including metal such as iron or aluminum. Multiple branch pipes 25 are attached to each header 24.

When the vehicle 100 is traveling, passing air heated with heat transferred from the fins 23 at the front in the travel direction of the vehicle 100 flows rearward in the travel direction of the vehicle 100. Thus, the electronic device 1 may cool the electronic components located at the rear in the travel direction of the vehicle 100 less effectively than the electronic components located at the front in the travel direction of the vehicle 100. As described above, the headers 24 extending in X-direction and convection of the coolant in the headers 24 facilitate dispersion of heat in X-direction, and reduce nonuniform cooling of the electronic components arranged in X-direction.

Each branch pipe 25 extends away from the heat-receiving block 21, for example, in the positive Z-direction. Each branch pipe 25 is attached to the corresponding header 24 by, for example, welding, brazing, or soldering and continuous with the header 24. Each branch pipe 25 is formed of a highly thermally conductive material including metal such as iron or aluminum.

Each branch pipe 25 has a length below a vehicle limit in the cross section taken perpendicularly to the travel direction of the vehicle 100, more specifically, a YZ plane. The vehicle limit indicates a maximum dimension of the vehicle 100. In Embodiment 1, the branch pipes 25 have different lengths corresponding to the vehicle limit. More specifically, as illustrated in FIG. 3, the length of the branch pipes 25 in Z-direction attached to the two headers 24 at both the ends in Y-direction is shorter than the length of the branch pipes 25 in Z-direction attached to the four headers 24 in the middle in Y-direction.

The fins 23 are arranged in at least the width direction or the travel direction of the vehicle 100 with spaces between the fins 23. In Embodiment 1, the fins 23 are arranged in the width direction of the vehicle 100, or in other words, in Y-direction, with spaces between the fins 23. The fins 23 are further arranged in the direction away from the heat-receiving block 21, or in other words, in Z-direction, with spaces between the fins 23.

The fins 23 arranged in the above manner are attached to the heat transfer members 22. More specifically, the fins 23 are attached to the heat transfer members 22 to receive the heat transfer members 22 in through-holes in the fins 23. The fins 23 attached to the heat transfer members 22 dissipate heat transferred from the electronic components through the heat-receiving block 21 and the heat transfer members 22 into ambient air. In Embodiment 1, the fins 23 are plates of a highly thermally conductive material including metal such as iron or aluminum.

To enhance the cooling performance for the electronic components when the vehicle 100 is traveling, the main surfaces of the fins 23 may be parallel to X-axis. The passing air created by the traveling vehicle 100 flows in X-direction. Thus, the fins 23 having the main surfaces parallel to X-axis can efficiently transfer heat from the fins 23 to passing air flowing between the fins 23. This structure can cool the electronic components including the switching elements SW1, SW2, and SW3.

In Embodiment 1, the fins 23 are attached to the heat transfer members 22, more specifically, to the branch pipes 25, with the main surfaces extending substantially horizontally for the vehicle 100 located horizontally. The main surfaces extending substantially horizontally refer to the main surfaces that form a sufficiently small angle with the horizontal plane, for example, lower than or equal to 10 degrees.

The cover 30 is attached to the housing 20 to cover the heat-receiving block 21, the heat transfer members 22, and the fins 23. The cover 30 is rigid and strong enough to resist deformation under the maximum expected vibration from the railway vehicle. For example, the cover 30 is formed of metal such as iron or aluminum. The cover 30 is attached to the housing 20 by, for example, fastening with fasteners, welding, or brazing.

Figure 5:
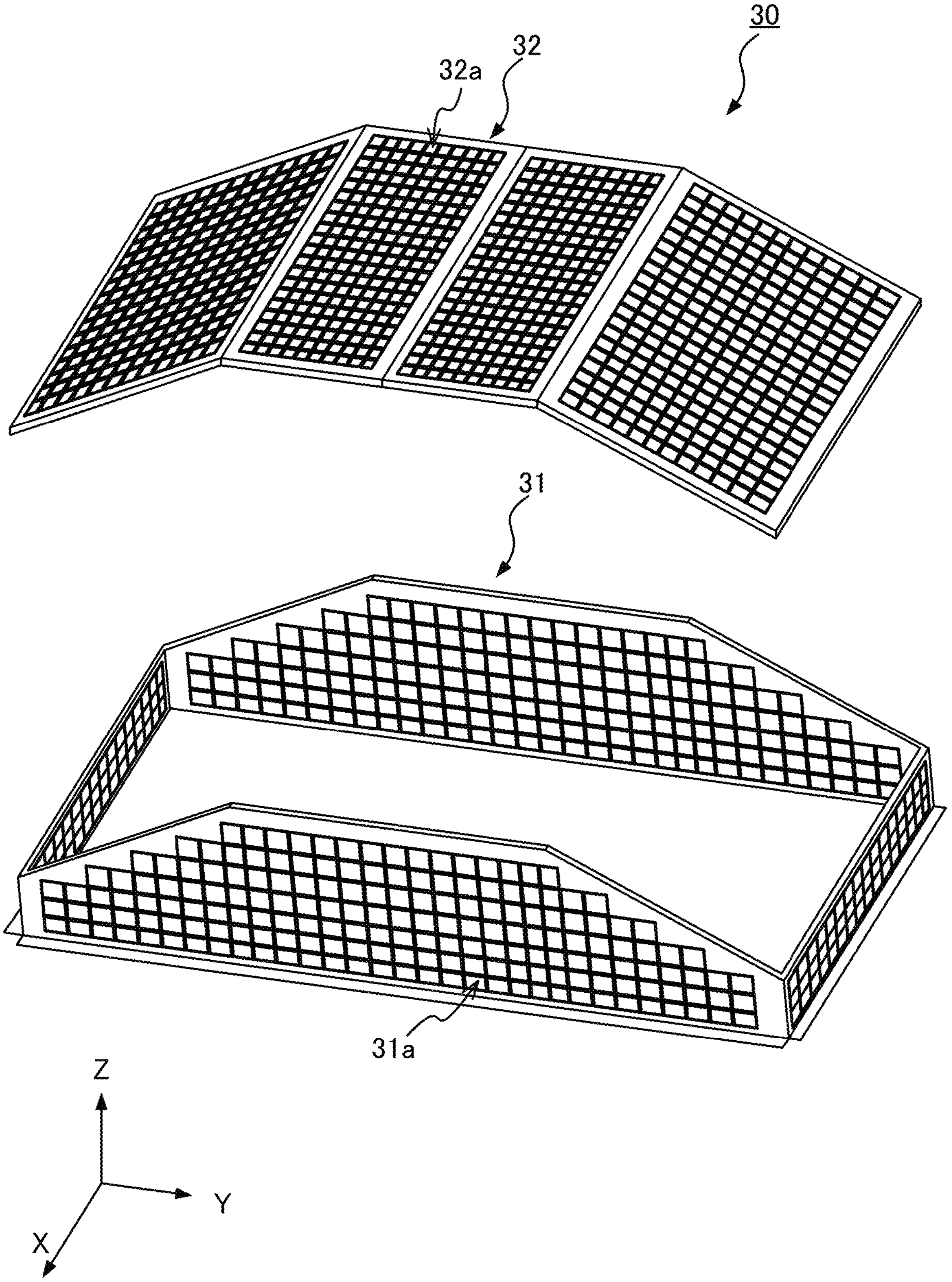
FIG. 5 is an exploded perspective view of a cover in Embodiment 1.
Figure 6:
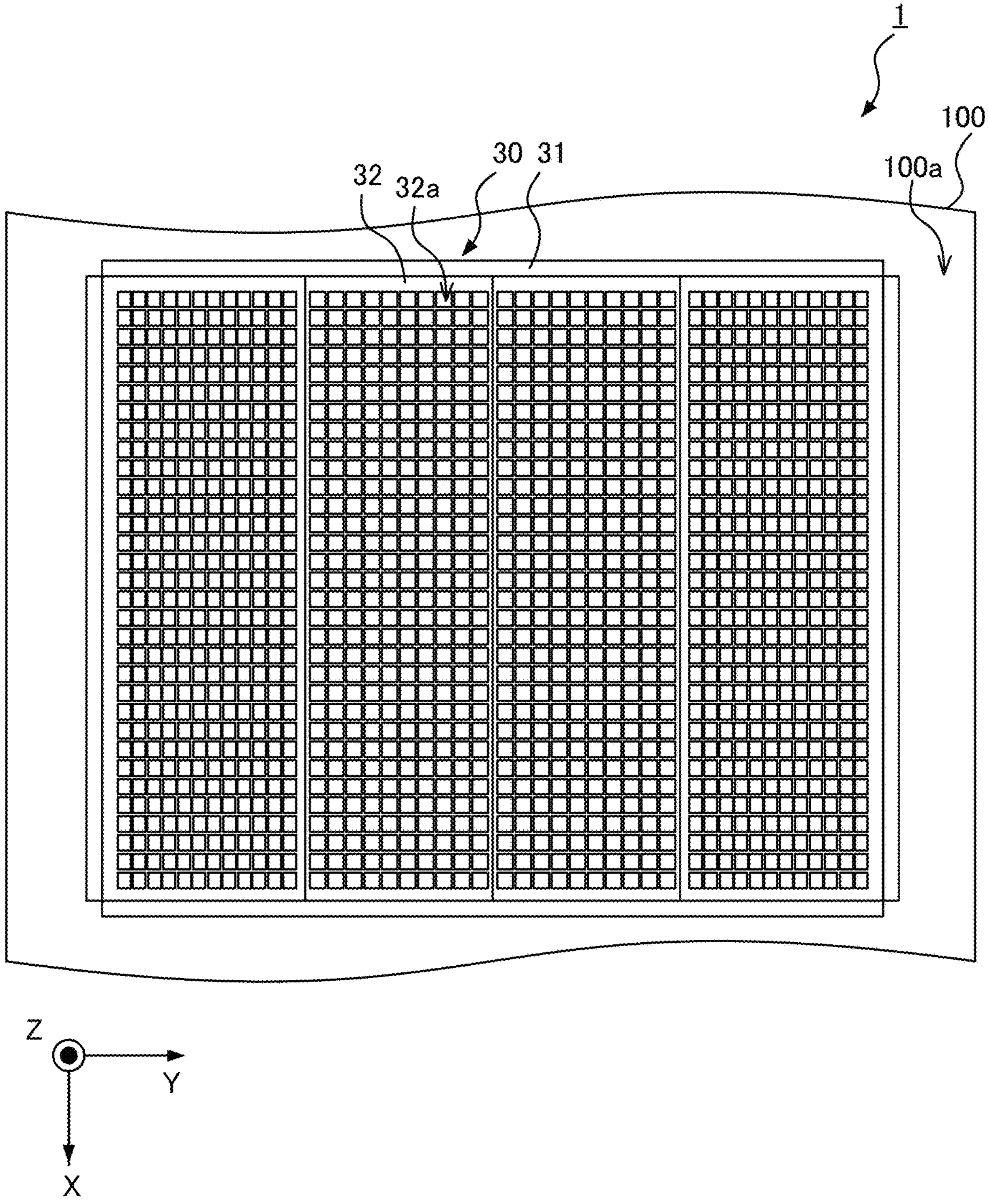
FIG. 6 is a top view of the electronic device according to Embodiment 1.

As illustrated in FIGS. 5 and 6, the cover 30 includes a side wall 31 extending in a direction surrounding the normal line to the second main surface 21*b*, and a lid 32 attached to the side wall 31 with the heat transfer members 22 located between the lid 32 and the heat-receiving block 21. The normal line to the second main surface 21*b* is parallel to Z-axis. The side wall 31 thus has a tubular shape extending about Z-axis. The lid 32 is attached to the side wall 31 in an orientation to close an opening at one end of the side wall 31.

The cover 30 accommodates the heat-receiving block 21, the heat transfer members 22, and the fins 23 in the space surrounded by the side wall 31 and the lid 32. The cover 30 has through-holes serving as vents in at least the outer surfaces of the side wall 31 intersecting with the travel direction of the vehicle, or in other words, X-direction. The ratio of the open areas of the vents to the areas of the outer surfaces of the side wall 31 is higher than the ratio of the open areas of the vents to the areas of the outer surfaces of the lid 32.

In Embodiment 1, the vents include first vents 31*a* that are through-holes in the side wall 31 and second vents 32*a* that are through-holes in the lid 32. More specifically, the first vents 31*a* are located in the outer surfaces of the side wall 31, and the second vents 32*a* are located in the outer surfaces of the lid 32. In this case, the ratio of the open areas of the vents to the areas of the outer surfaces of the side wall 31 is the ratio of the sum of the open areas of the first vents 31*a* in the outer surfaces of the side wall 31 to the sum of the areas of the outer surfaces of the side wall 31. The ratio of the open areas of the vents to the areas of the outer surfaces of the lid 32 is the ratio of the sum of the open areas of the second vents 32*a* in the outer surfaces of the lid 32 to the sum of the areas of the outer surfaces of the lid 32.

Figure 7:
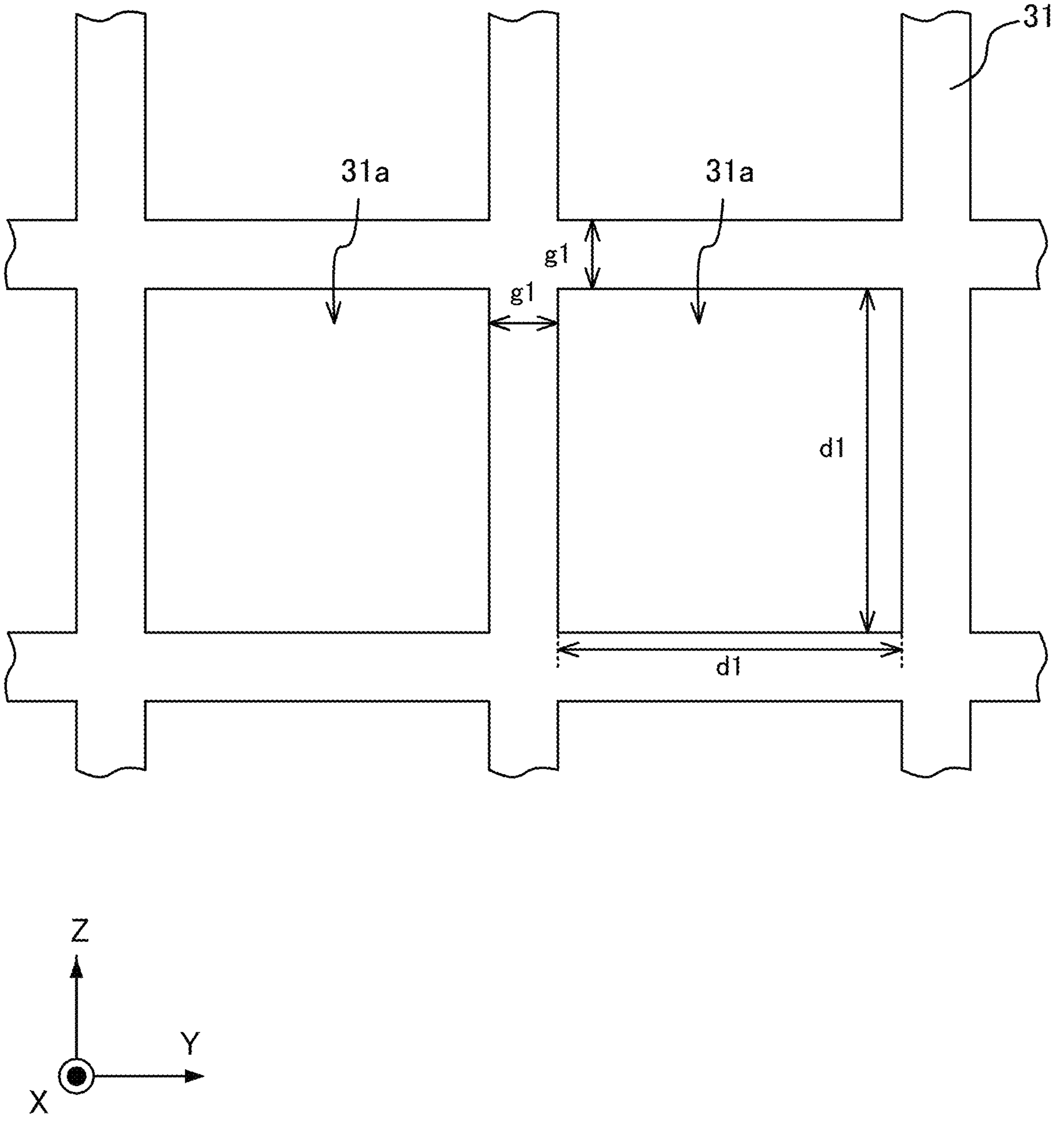
FIG. 7 is a diagram of example first vents in a side wall of the cover in Embodiment 1.

The first vents 31*a* in the surfaces of the side wall 31 have the same shape. As illustrated in FIG. 7 that is an enlarged view of an outer surface of the side wall 31 intersecting with X-axis as viewed in the negative X-direction, each first vent 31*a* is substantially square, with a length d1 on each side. In the outer surfaces of the side wall 31 intersecting with X-axis, the first vents 31*a* are arranged at intervals g1 in Z-direction and Y-direction. Although not illustrated, in the outer surfaces of the side wall 31 intersecting with Y-axis, the first vents 31*a* are arranged at intervals g1 in Z-direction and X-direction.

Figure 8:
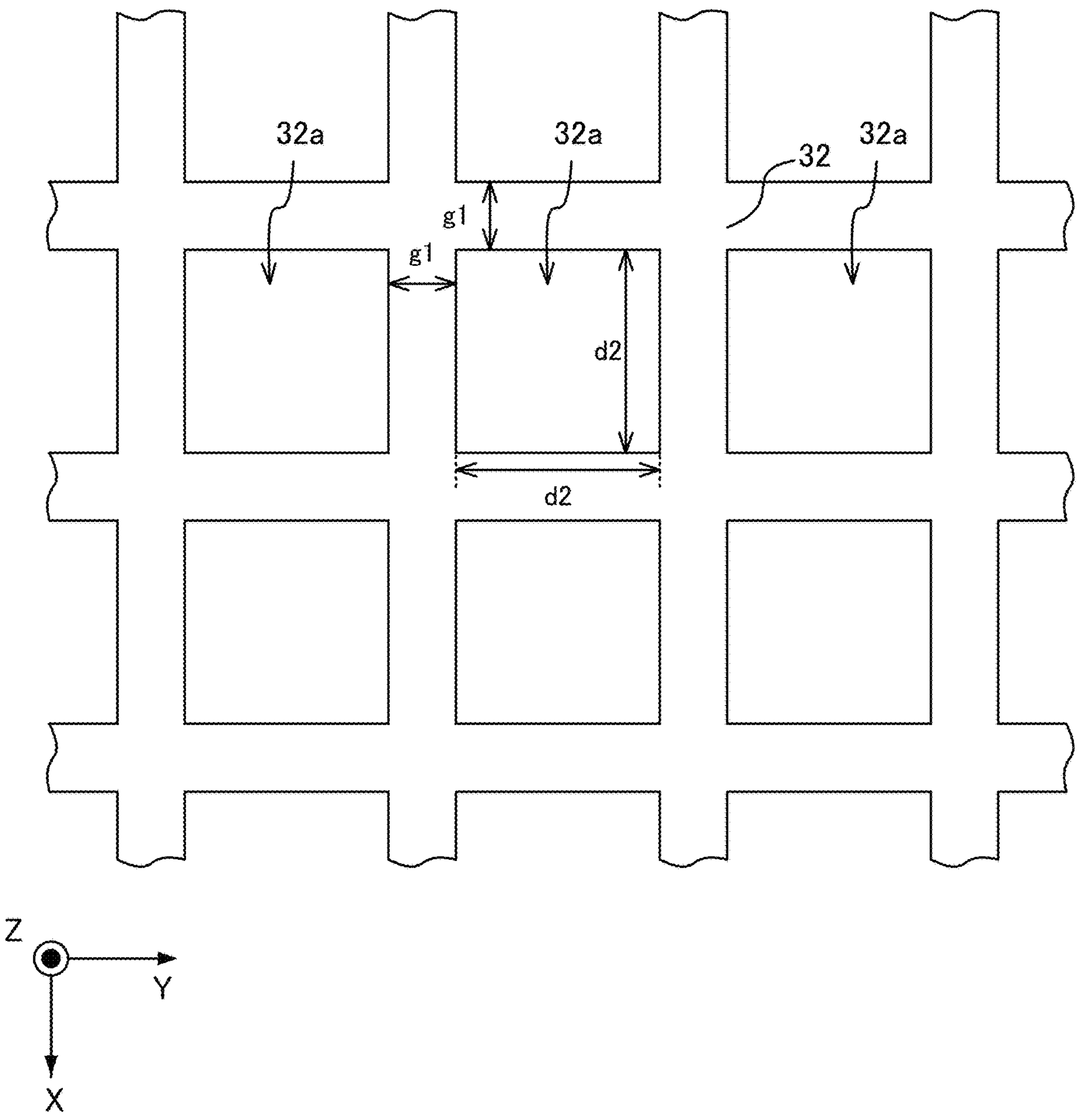
FIG. 8 is a diagram of example second vents in a lid of the cover in Embodiment 1.

As illustrated in FIGS. 5 and 6, the second vents 32*a* in the outer surfaces of the lid 32 have the same shape. As illustrated in FIG. 8 that is an enlarged view of the outer surface of the lid 32 perpendicular to Z-axis as viewed in the negative Z-direction, each second vent 32*a* is substantially square, with a length d2 on each side. The second vents 32*a* are arranged at intervals g1 in X-direction and a direction perpendicular to X-axis in the outer surface of the lid 32. In the outer surfaces of the lid 32 perpendicular to Z-axis, the second vents 32*a* are arranged at intervals g1 in X-direction and Y-direction.

As described above, the intervals g1 between the first vents 31*a* are the same as the intervals g1 between the second vents 32*a*, and the length d2 of each side of the second vents 32*a* is shorter than the length d1 of each side of the first vents 31*a*. Thus, the ratio of the open areas of the first vents 31*a* to the areas of the outer surfaces of the side wall 31 is higher than the ratio of the open areas of the second vents 32*a* to the areas of the outer surfaces of the lid 32. The electronic device 1 can thus lower the likelihood of reduced thermal radiation from the fins 23 resulting from sunlight exposure more effectively than an electronic device having many vents, such as the first vents 31*a*, located uniformly across the full portion of the cover. For example, the ratio of the open areas of the first vents 31*a* to the areas of the outer surfaces of the side wall 31 is preferably higher than or equal to 0.7, and the ratio of the open areas of the second vents 32*a* to the areas of the outer surfaces of the lid 32 is preferably lower than or equal to 0.6.

Cooling of the electronic components of the electronic device 1 with the above structure is described below. Heat generated by at least one of the switching elements SW1, SW2, and SW3 is transferred to the coolant through the heat-receiving block 21 and the headers 24. This evaporates the coolant. The evaporated coolant flows into the branch pipes 25 from the headers 24 and moves in the branch pipes 25 in the positive Z-direction. While moving in the positive Z-direction, the coolant transfers heat to air around the heat transfer members 22 through the branch pipes 25 and the fins 23. The coolant then cools and liquefies. The liquid coolant moves in the negative Z-direction along the inner walls of the branch pipes 25. As described above, the coolant circulates while repeating evaporation and liquefaction to transfer heat generated by at least any of the switching elements SW1, SW2, and SW3 to air around the heat transfer members 22 and cool the switching elements SW1, SW2, and SW3 generating heat.

Figure 9:
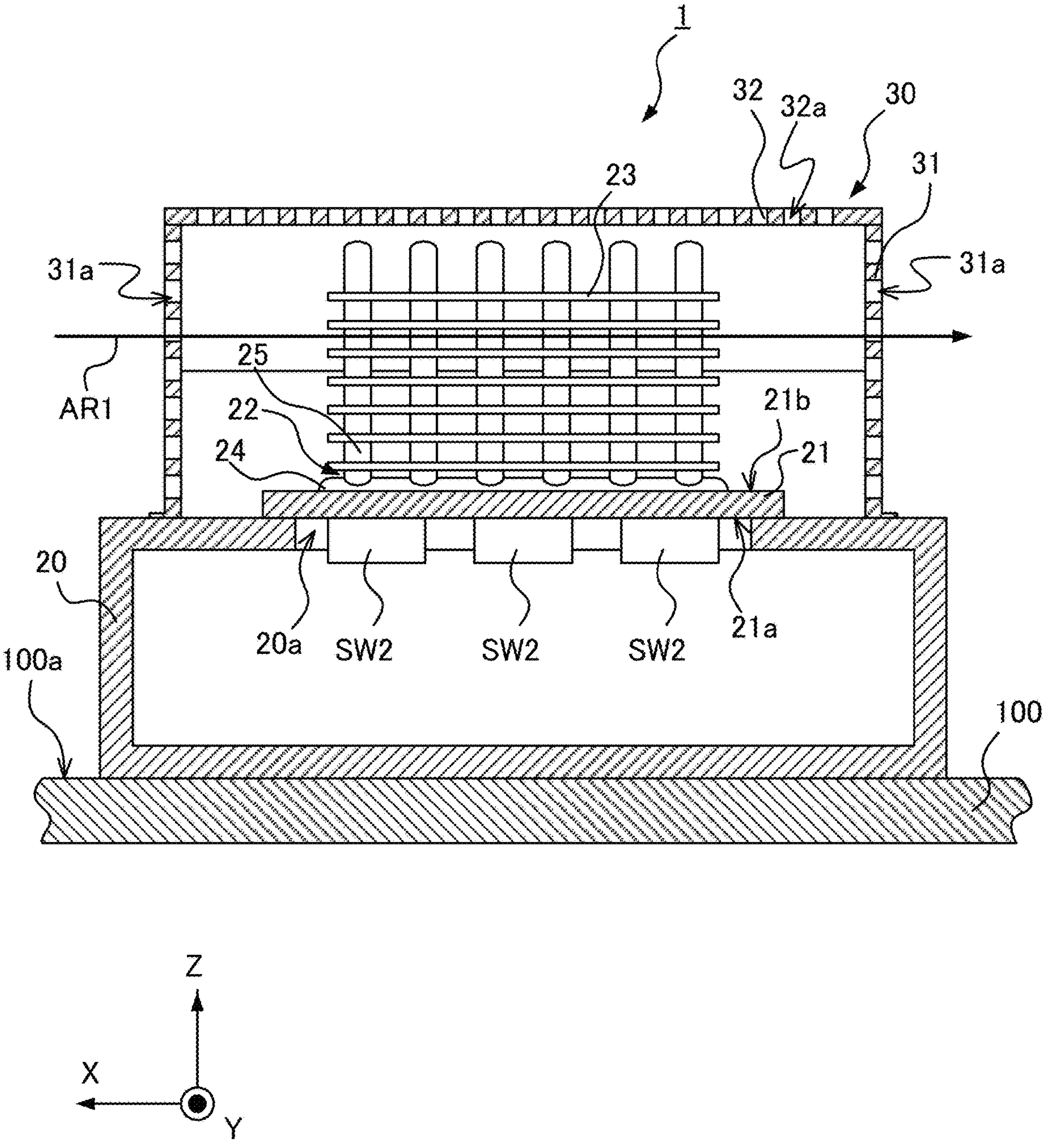
FIG. 9 is a diagram illustrating example passing air through the electronic device according to Embodiment 1.

For example, when the vehicle 100 travels in the positive X-direction, passing air flows in the negative X-direction as indicated by the arrow AR1 in FIG. 9. For simplicity, FIG. 9 illustrates a portion of the airflow. The passing air flows between the fins 23. The passing air flowing between the fins 23 receives heat transferred from the fins 23 and cools the switching elements SW1, SW2, and SW3.

When the vehicle 100 is stopped, no passing air flows unlike in FIG. 9. Air heated with heat transferred from the fins 23 or the branch pipes 25 moves vertically upward through the spaces between the fins 23 as indicated by the arrows AR2 in FIGS. 10 and 11. For simplicity, FIGS. 10 and 11 simply illustrate a portion of airflow. Air moving vertically upward flows out of the cover 30 through the second vents 32*a* in the lid 32 of the cover 30

Figure 10:
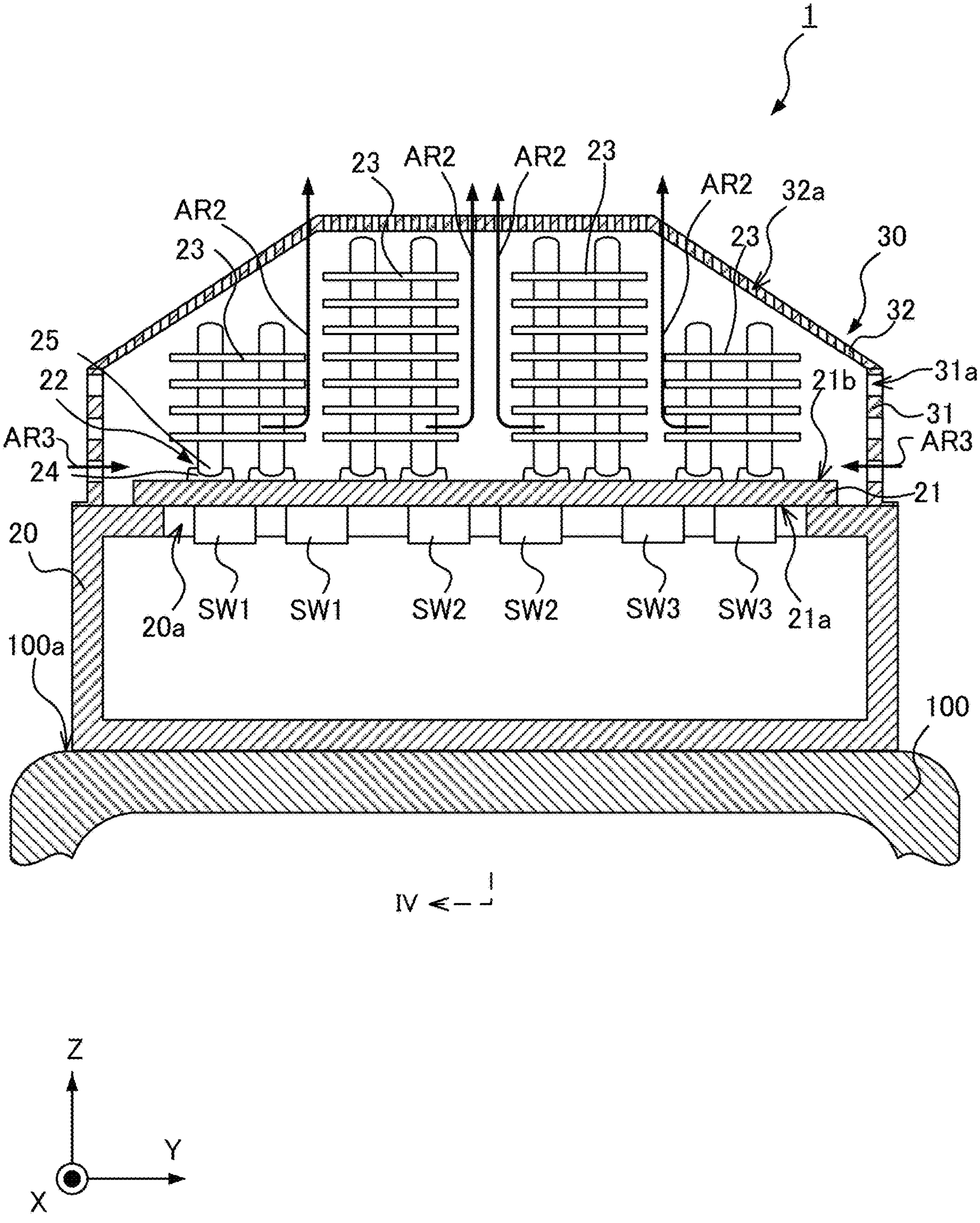
FIG. 10 is a diagram illustrating an example natural convection flow through the electronic device according to Embodiment 1.
Figure 11:
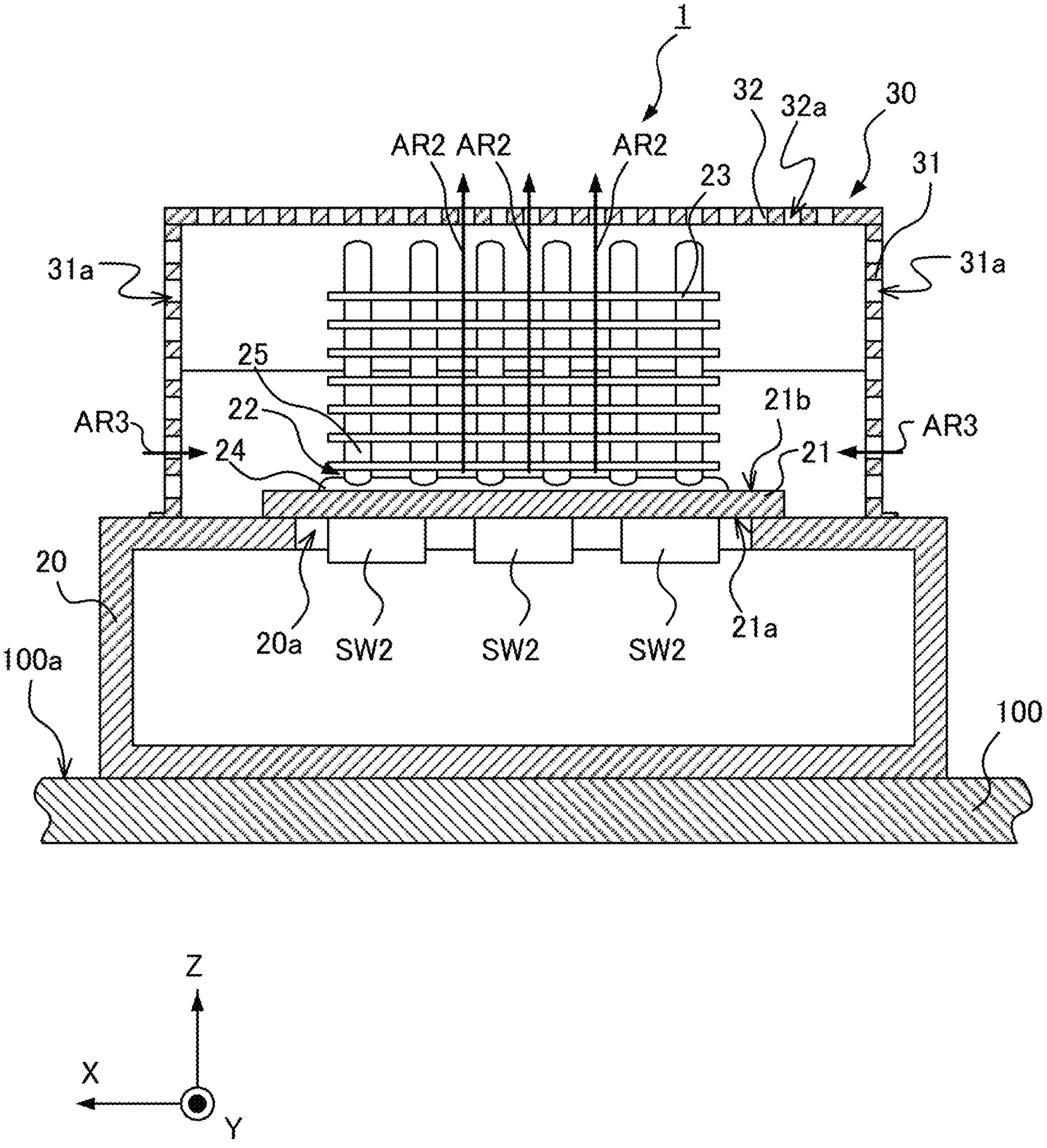
FIG. 11 is a diagram illustrating an example natural convection flow through the electronic device according to Embodiment 1.

As the air inside the cover 30 flows out through the second vents 32*a*, air outside the cover 30 flows into the cover 30 through the first vents 31*a* in the side wall 31 of the cover 30 as indicated by the arrows AR3 in FIGS. 10 and 11.

The air flowing into the cover 30 as indicated by the arrows AR3 receives heat transferred from the fins 23 to be heated and moves vertically upward through the spaces between the fins 23 as indicated by the arrows AR2, flowing out of the cover 30 through the second vents 32*a*. The switching elements SW1, SW2, and SW3 can thus be cooled also when the vehicle 100 is stopped through such natural convection.

Both when the vehicle 100 is traveling and when the vehicle 100 is stopped, thermal radiation from the fins 23 located at the vertically upper end transfers heat to the inner surfaces of the lid 32 to cool the switching elements SW1, SW2, and SW3.

As described above, the cover 30 included in the electronic device 1 according to Embodiment 1 has the ratio of the open areas of the first vents 31*a* to the areas of the outer surfaces of the side wall 31 higher than the ratio of the open areas of the second vents 32*a* to the areas of the outer surfaces of the lid 32. In other words, the ratio of the open areas of the second vents 32*a* to the areas of the outer surfaces of the lid 32 is lower than the ratio of the open areas of the first vents 31*a* to the areas of the outer surfaces of the side wall 31. The electronic device 1 thus lowers the likelihood of reduced thermal radiation from the fins 23 resulting from exposure to sunlight more effectively than an electronic device having many vents, such as the first vents 31*a*, located uniformly across the full portion of the cover. Thus, the electronic device 1 can cool the electronic components also in sunny weather.

The ratio of the open areas of the first vents 31*a* to the areas of the outer surfaces of the side wall 31 intersecting with the travel direction, or in other words, X-direction, is higher than the ratio of the open areas of the second vents 32*a* to the areas of the outer surfaces of the lid 32. This structure can lower the likelihood of reduced thermal radiation from the fins 23 resulting from exposure to sunlight, when the vehicle 100 is traveling, this structure can effectively cool the switching elements SW1, SW2, and SW3 with passing air created by the vehicle 100.

The lid 32 having the second vents 32*a* smaller than the first vents 31*a* can lower the likelihood of reduced thermal radiation from the fins 23 resulting from exposure to sunlight and allow, when the vehicle 100 is stopped, air heated with heat transferred from the fins 23 to flow out of the cover 30 through the second vents 32*a*. Thus, the switching elements SW1, SW2, and SW3 can be cooled through natural convection when the vehicle 100 is stopped.

Embodiment 2

The cover 30 may have any shape other than the shape in the above example to lower the likelihood of reduced thermal radiation from the fins 23 resulting from exposure to sunlight. An electronic device 2 according to Embodiment 2 includes a cover 30 having a shape different from the shape of the cover 30 in Embodiment 1, and is described focusing on the differences from the electronic device 1.

Figure 12:
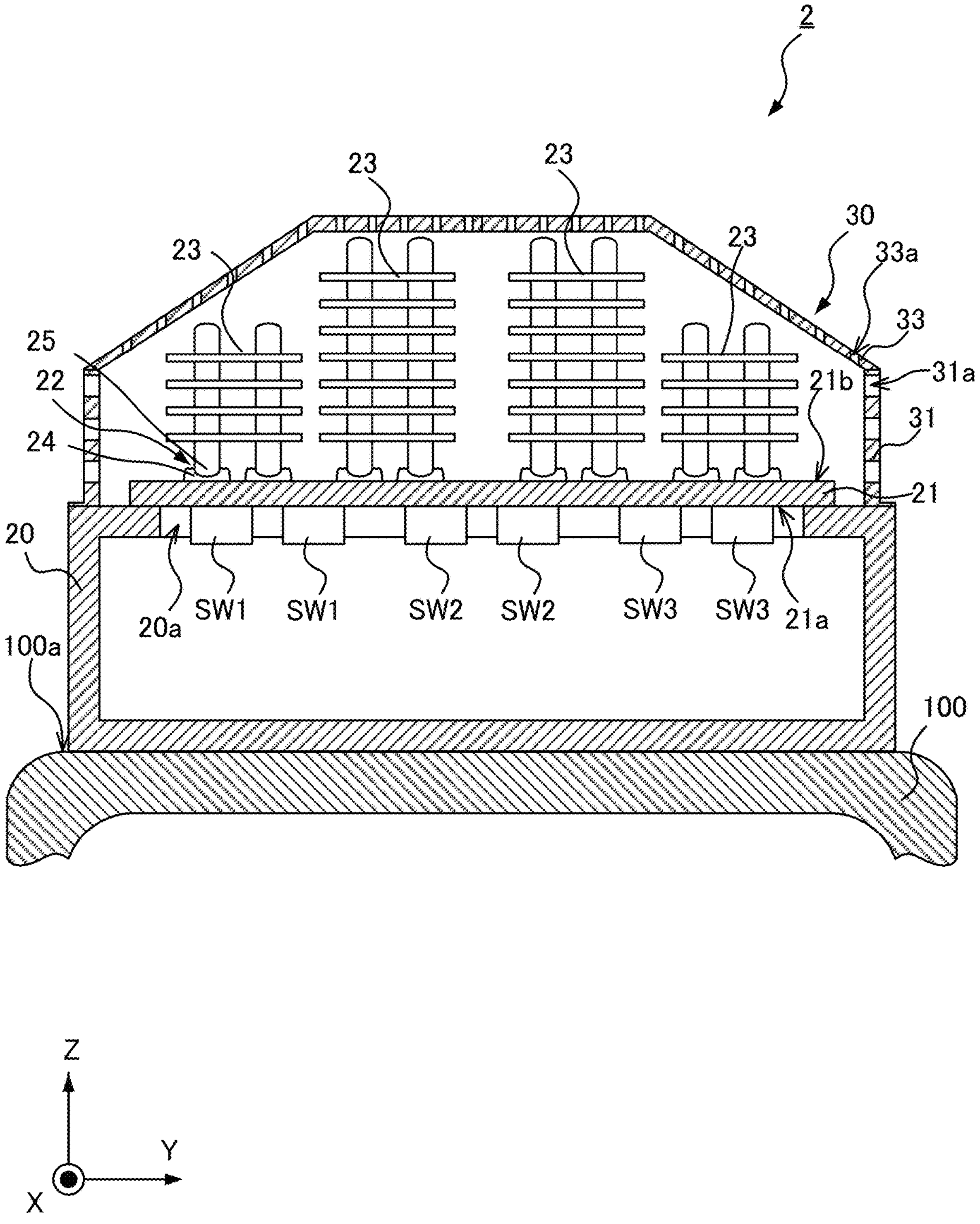
FIG. 12 is a cross-sectional view of an electronic device according to Embodiment 2.

The cover 30 included in the electronic device 2 illustrated in FIG. 12 includes the side wall 31 and a lid 33 attached to the side wall 31 with the heat transfer members 22 located between the lid 33 and the heat-receiving block 21. The cover 30 accommodates the heat-receiving block 21, the heat transfer members 22, and the fins 23 in the space surrounded by the side wall 31 and the lid 33. The cover 30 has vents in at least the surfaces of the side wall 31 intersecting with X-direction. The ratio of the open areas of the vents to the areas of the outer surfaces of the side wall 31 is higher than the ratio of the open areas of the vents to the areas of the outer surfaces of the lid 33.

In Embodiment 2, as in Embodiment 1, the vents include first vents 31*a* in the outer surfaces of the side wall 31 and second vents 33*a* in the outer surfaces of the lid 33. In this case, as in Embodiment 1, the ratio of the open areas of the vents to the areas of the outer surfaces of the side wall 31 is the ratio of the sum of the open areas of the first vents 31*a* in the outer surfaces of the side wall 31 to the sum of the areas of the outer surfaces of the side wall 31. The ratio of the open areas of the vents to the areas of the outer surfaces of the lid 33 is the ratio of the sum of the open areas of the second vents 33*a* in the outer surfaces of the lid 33 to the sum of the areas of the outer surfaces of the lid 33. The intervals between the second vents 33*a* in the lid 33 are wider than the intervals between the second vents 32*a* in the lid 32 illustrated in FIG. 3.

Figure 13:
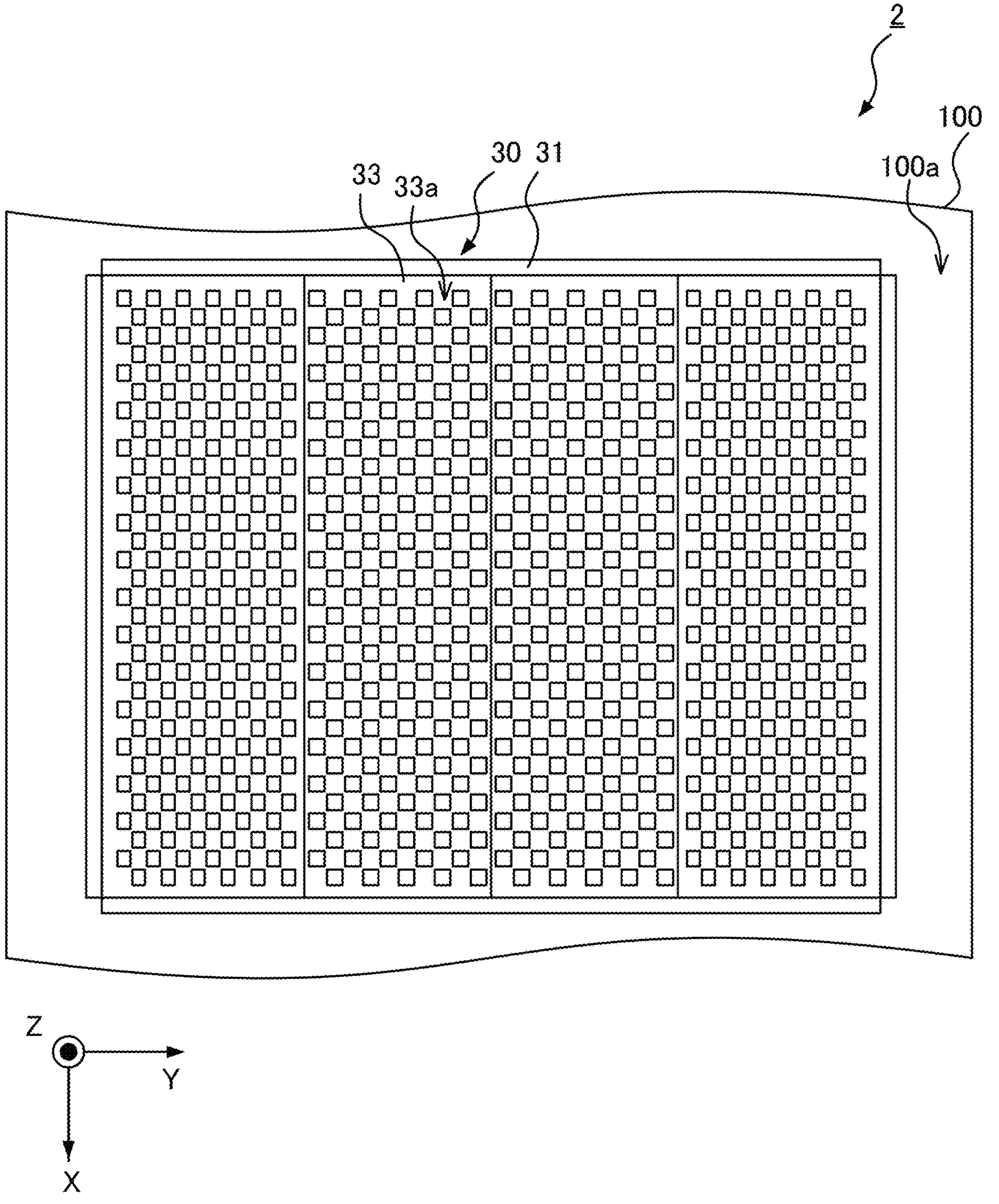
FIG. 13 is a top view of the electronic device according to Embodiment 2.
Figure 14:
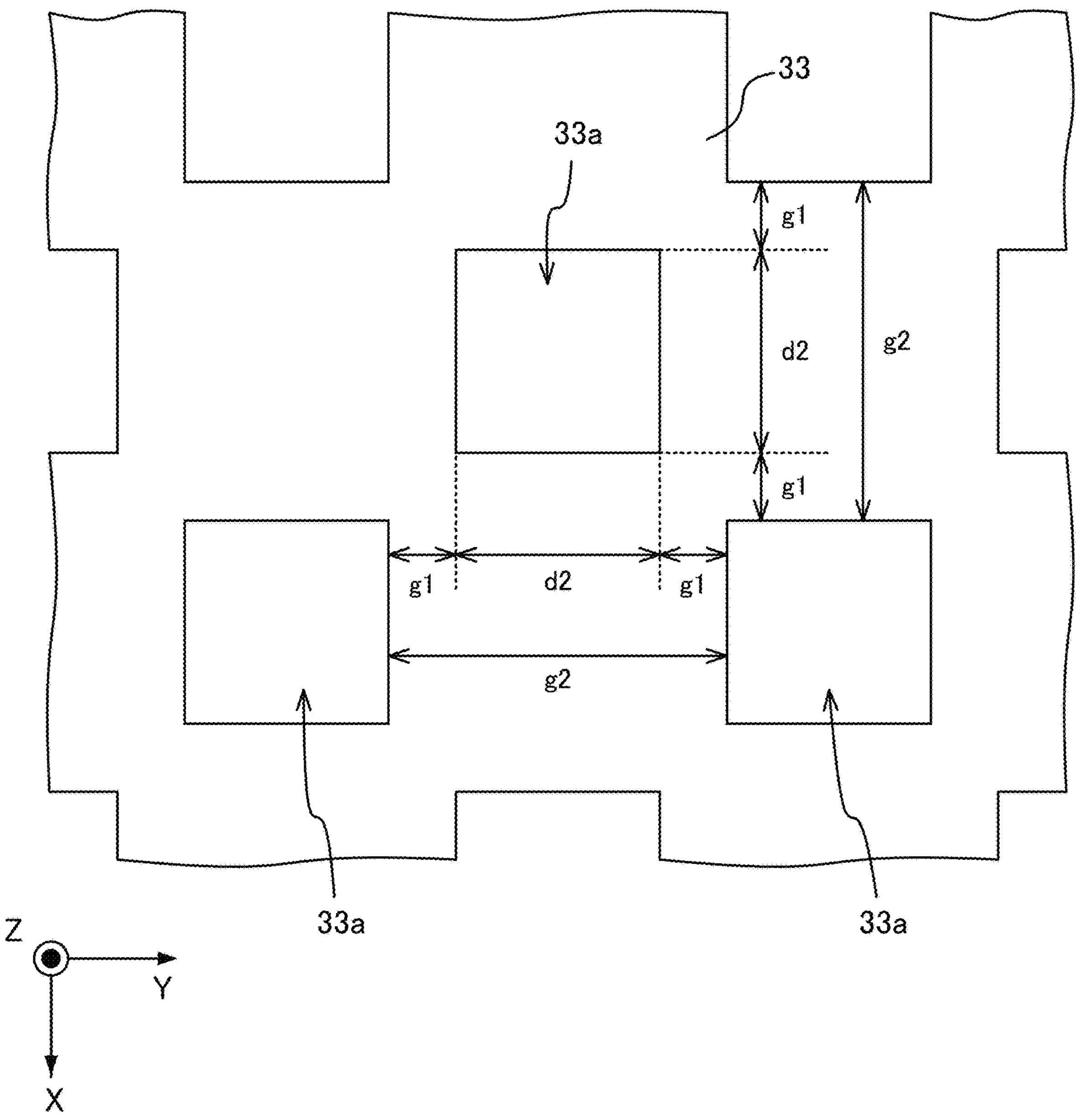
FIG. 14 is a diagram of example second vents in a lid of a cover in Embodiment 2.

As illustrated in FIG. 13, the second vents 33*a* in the outer surfaces of the lid 33 have the same shape. As illustrated in FIG. 14 that is an enlarged view of the surface of the lid 33 perpendicular to Z-axis as viewed in the negative Z-direction, each second vent 33*a* is substantially square, with a length d2 on each side as in the second vents 32*a* in Embodiment 1. The second vents 33*a* are arranged at wider intervals than the second vents 32*a* in Embodiment 1.

More specifically, the second vents 33*a* are arranged in the outer surfaces of the lid 33 at intervals g2=g1+d2+g1 in X-direction and in a direction perpendicular to X-axis. In the outer surfaces of the lid 33 perpendicular to Z-axis, the second vents 33*a* are arranged at the intervals g2 in X-direction and Y-direction. Thus, the second vents 33*a* are fewer than the second vents 32*a* in the lid 32 of the cover 30 included in the electronic device 1 according to Embodiment 1.

As described above, the intervals g1 between the first vents 31*a* are shorter than the intervals g2 between the second vents 33*a*, and the length d2 of each side of the second vents 32*a* is shorter than the length d1 of each side of the first vents 31*a*. Thus, the ratio of the open areas of the first vents 31*a* to the areas of the outer surfaces of the side wall 31 is higher than the ratio of the open areas of the second vents 33*a* to the areas of the outer surfaces of the lid 33.

The electronic device 2 with the above structure cools the electronic components with the same mechanism as in Embodiment 1.

As described above, the cover 30 included in the electronic device 2 according to Embodiment 2 has the ratio of the open areas of the second vents 33*a* to the areas of the outer surfaces of the lid 33 lower than the ratio of the open areas of the first vents 31*a* to the areas of the outer surfaces of the side wall 31. The ratio of the open areas of the second vents 33*a* to the areas of the outer surfaces of the lid 33 is lower than in Embodiment 1. The structure can further lower the likelihood of reduced thermal radiation from the fins 23 resulting from exposure to sunlight. Thus, the electronic device 2 has higher cooling performance for the electronic components in sunny weather.

Embodiment 3

The fins and the cover 30 may have any shapes other than in the above examples. An electronic device 3 according to Embodiment 3 includes fins and a cover 30 with shapes different from the shapes of the fins and the cover 30 in Embodiments 1 and 2, and is described focusing on the differences from Embodiments 1 and 2.

Figure 15:
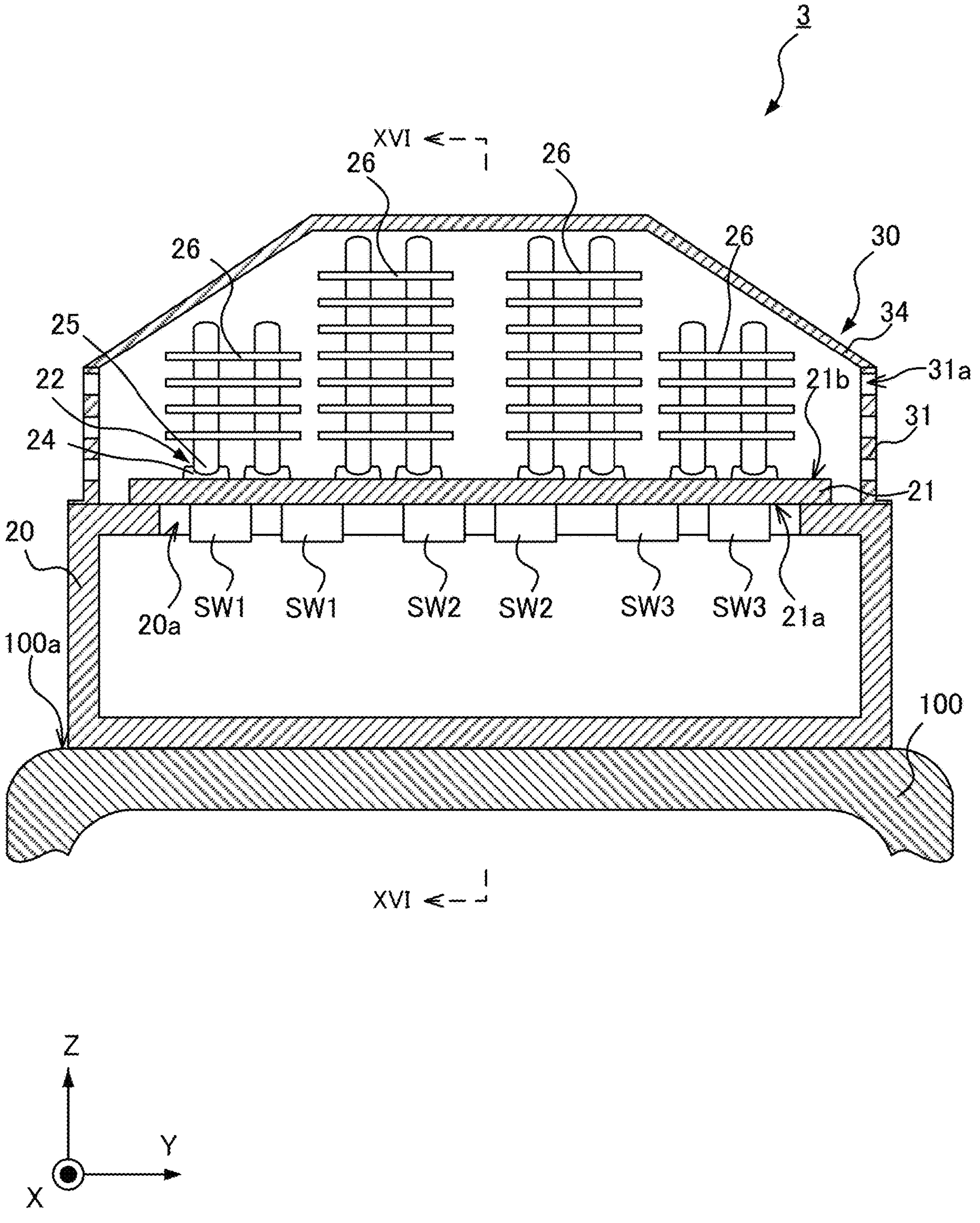
FIG. 15 is a cross-sectional view of an electronic device according to Embodiment 3.
Figure 16:
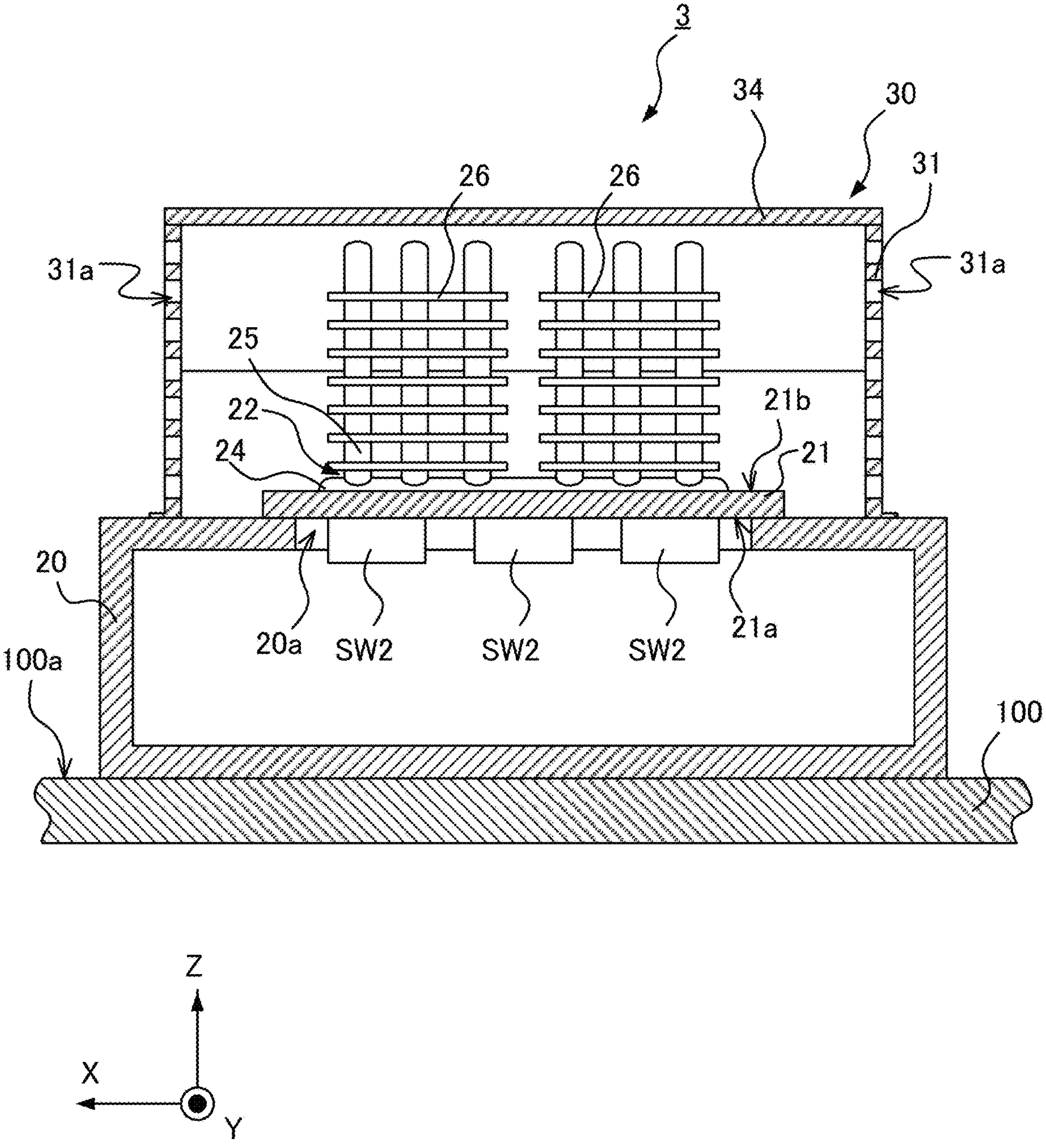
FIG. 16 is a cross-sectional view of the electronic device according to Embodiment 3 taken along line XVI-XVI in FIG. 15 as viewed in the direction indicated by the arrows.

The electronic device 3 illustrated in FIGS. 15 and 16 includes multiple fins 26 arranged in X-direction, Y-direction, and Z-direction with spaces between the fins 26. For the vehicle 100 located horizontally, the fins 26 are attached to the heat transfer members 22, or in other words, the branch pipes 25, with the main surfaces extending substantially horizontally.

The cover 30 included in the electronic device 3 includes the side wall 31 and a lid 34 attached to the side wall 31 with the heat transfer members 22 located between the lid 34 and the heat-receiving block 21. The cover 30 accommodates the heat-receiving block 21, the heat transfer members 22, and the fins 26 in the space surrounded by the side wall 31 and the lid 34.

The cover 30 has vents in at least the outer surfaces of the side wall 31 intersecting with X-direction. In Embodiment 3, the side wall 31 has the first vents 31*a* in each of the outer surfaces. The first vents 31*a* in the outer surfaces of the side wall 31 have the same shape and are at the same intervals as in Embodiment 1.

Figure 17:
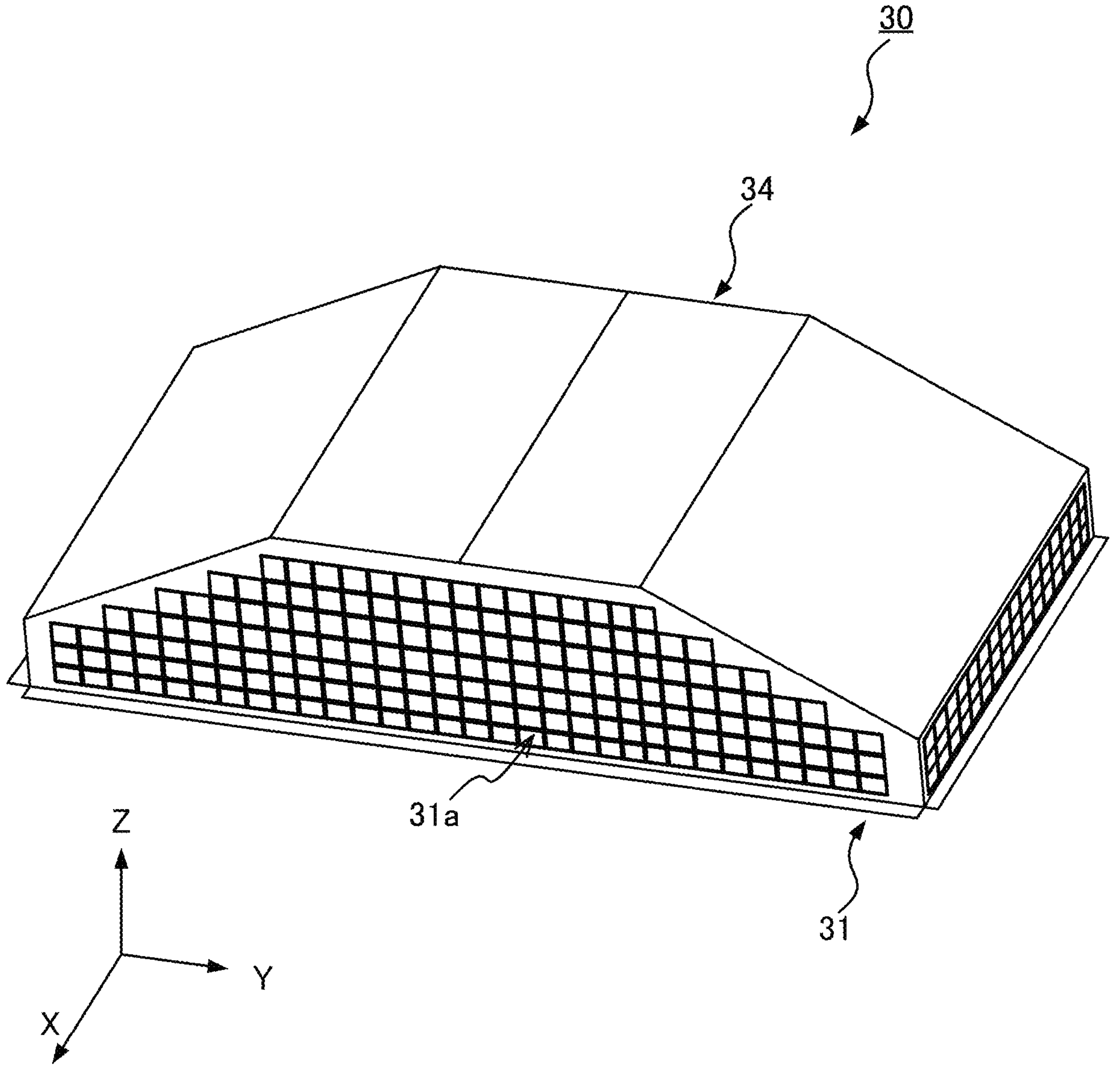
FIG. 17 is a perspective view of a cover in Embodiment 3.

As illustrated in FIGS. 15, 16, and 17, the lid 34 has no vents, and thus the ratio of the open areas of the vents to the areas of the outer surfaces of the lid 34 is zero. In other words, in Embodiment 3, the side wall 31 alone has vents, more specifically, the first vents 31*a*. The ratio of the open areas of the vents to the areas of the outer surfaces of the side wall 31 is thus higher than the ratio of the open areas of the vents to the areas of the outer surfaces of the lid 34.

Cooling of the electronic components of the electronic device 3 with the above structure is described below. When the vehicle 100 is traveling, as in Embodiment 1, passing air receives heat from the fins 26 and cools the electronic components, more specifically, the switching elements SW1, SW2, and SW3.

Figure 18:
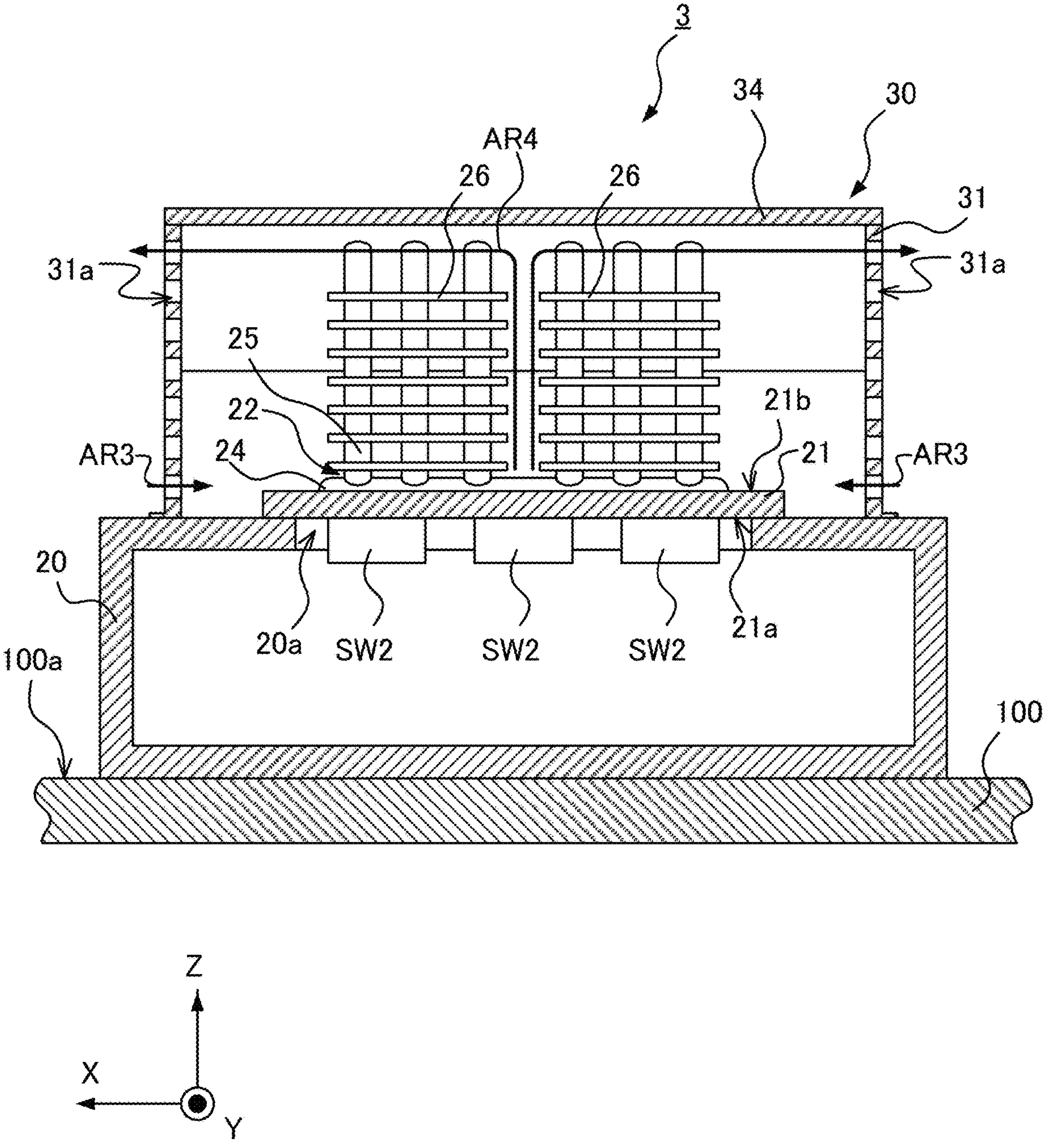
FIG. 18 is a diagram illustrating an example natural convection flow through the electronic device according to Embodiment 3.

When the vehicle 100 is stopped, no passing air occurs. Air heated with heat transferred from the fins 26 or the branch pipes 25 moves vertically upward through the spaces between the fins 26, as indicated by the arrows AR4 in FIG. 18. The lid 34 of the cover 30 has no vents. Thus, the air that has moved in the positive Z-direction moves along the lid 34 of the cover 30, and flows out of the cover 30 through the first vents 31*a*. For simplicity, FIG. 18 illustrates a portion of the airflow. Although not illustrated in FIG. 18, a portion of the air that have moved vertically upward flows out of the cover 30 through the first vents 31*a* in the surfaces of the side wall 31 intersecting with Y-direction.

When air inside the cover 30 flows out through the first vents 31*a*, as in Embodiment 1, air outside the cover 30 flows into the cover 30 through the first vents 31*a* in the side wall 31 of the cover 30 as indicated by the arrows AR3. Although not illustrated in FIG. 18, as in Embodiment 1, air outside the cover 30 also flows into the cover 30 through the first vents 31*a* in the surfaces of the side wall 31 intersecting with Y-direction.

The air flowing into the cover 30 receives heat transferred from the fins 26 and the branch pipes 25 to be heated, moves vertically upward through the spaces between the fins 26 as described above, and flows along the lid 34 and out of the cover 30 through the first vents 31*a*. The switching elements SW1, SW2, and SW3 can thus be cooled through such natural convection also when the vehicle 100 is stopped.

Both when the vehicle 100 is traveling and when the vehicle 100 is stopped, heat is transferred to the inner surfaces of the lid 34 by thermal radiation from the fins 26 located at the vertical upper end to cool the switching elements SW1, SW2, and SW3.

As described above, the lid 34 of the cover 30 included in the electronic device 3 according to Embodiment 3 has no vents. This structure lowers the likelihood of reduced thermal radiation from the fins 26 resulting from exposure to sunlight. Thus, the electronic device 3 has higher cooling performance for the electronic components in sunny weather.

Embodiment 4

The fins and the cover 30 may have any shapes other than in the above examples. An electronic device 4 according to Embodiment 4 includes fins and a cover 30 with shapes different from the shapes of the fins and the cover 30 in Embodiments 1 to 3, and is described focusing on the differences from Embodiments 1 to 3.

Figure 19:
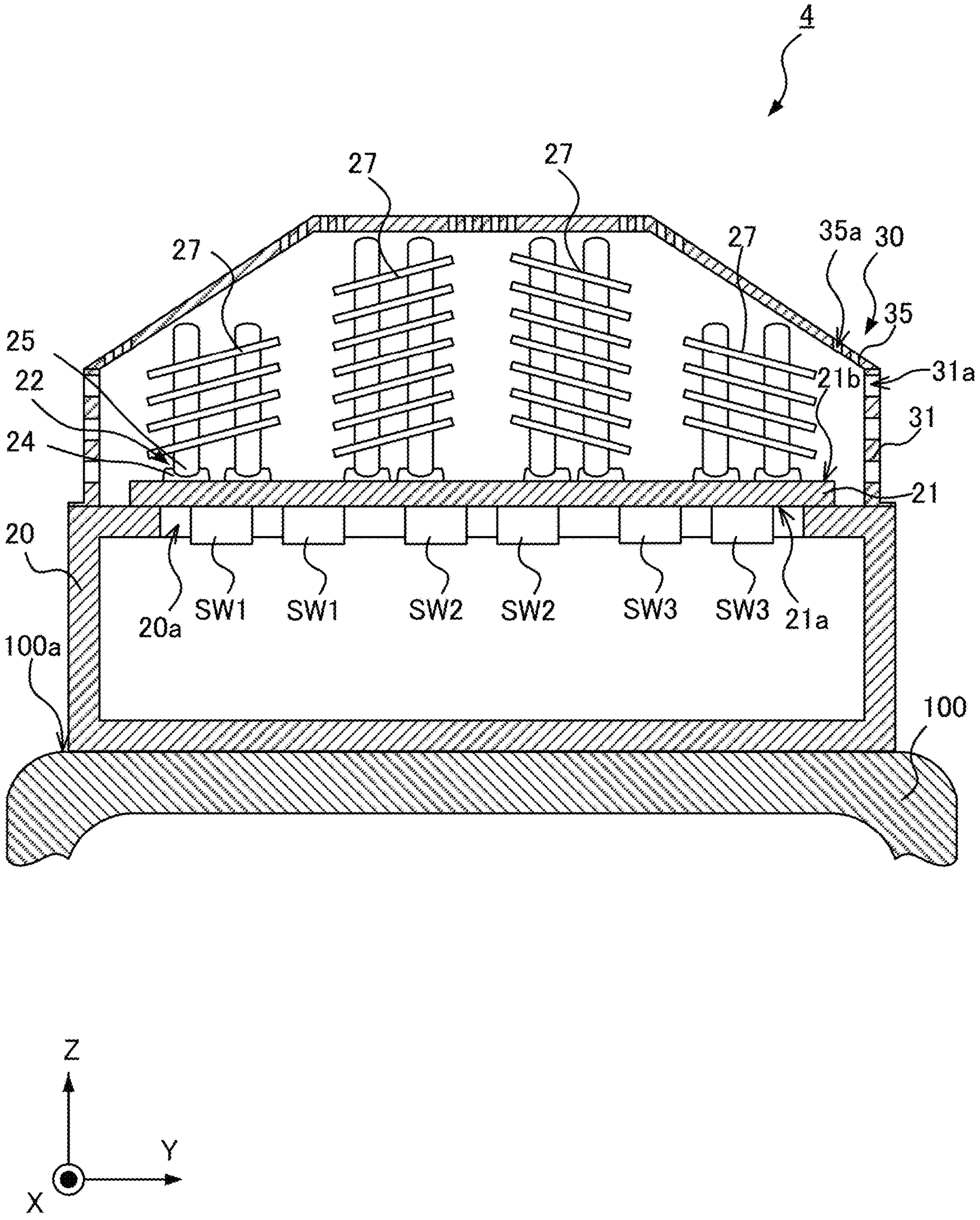
FIG. 19 is a cross-sectional view of an electronic device according to Embodiment 4.

The electronic device 4 illustrated in FIG. 19 includes multiple fins 27 attached to the heat transfer members 22 with the main surfaces inclined with respect to the second main surface 21*b*. In other words, the multiple fins 27 are attached to the branch pipes 25 of the heat transfer members 22 with the main surfaces inclined with respect to the horizontal plane for the vehicle 100 located horizontally. More specifically, the fins 27 are attached to the branch pipes 25 with the main surfaces inclined with respect to the second main surface 21*b* and parallel to X-axis.

The cover 30 included in the electronic device 4 includes the side wall 31 and a lid 35 attached to the side wall 31 with the heat transfer members 22 located between the lid 35 and the heat-receiving block 21. The cover 30 accommodates the heat-receiving block 21, the heat transfer members 22, and the fins 27 in the space surrounded by the side wall 31 and the lid 35.

The cover 30 has vents in at least the outer surfaces of the side wall 31 intersecting with X-direction. The ratio of the open areas of the vents to the areas of the outer surfaces of the side wall 31 is higher than the ratio of the open areas of the vents to the areas of the outer surfaces of the lid 35.

In Embodiment 4, as in Embodiment 1, the vents include first vents 31*a* in the outer surfaces of the side wall 31 and second vents 35*a* in the outer surfaces of the lid 35. In this case, as in Embodiment 1, the ratio of the open areas of the vents to the areas of the outer surfaces of the side wall 31 is the ratio of the sum of the open areas of the first vents 31*a* in the outer surfaces of the side wall 31 to the sum of the areas of the outer surfaces of the side wall 31. The ratio of the open areas of the vents to the areas of the outer surfaces of the lid 35 is the ratio of the sum of the open areas of the second vents 35*a* in the outer surfaces of the lid 35 to the sum of the areas of the outer surfaces of the lid 35.

Figure 20:
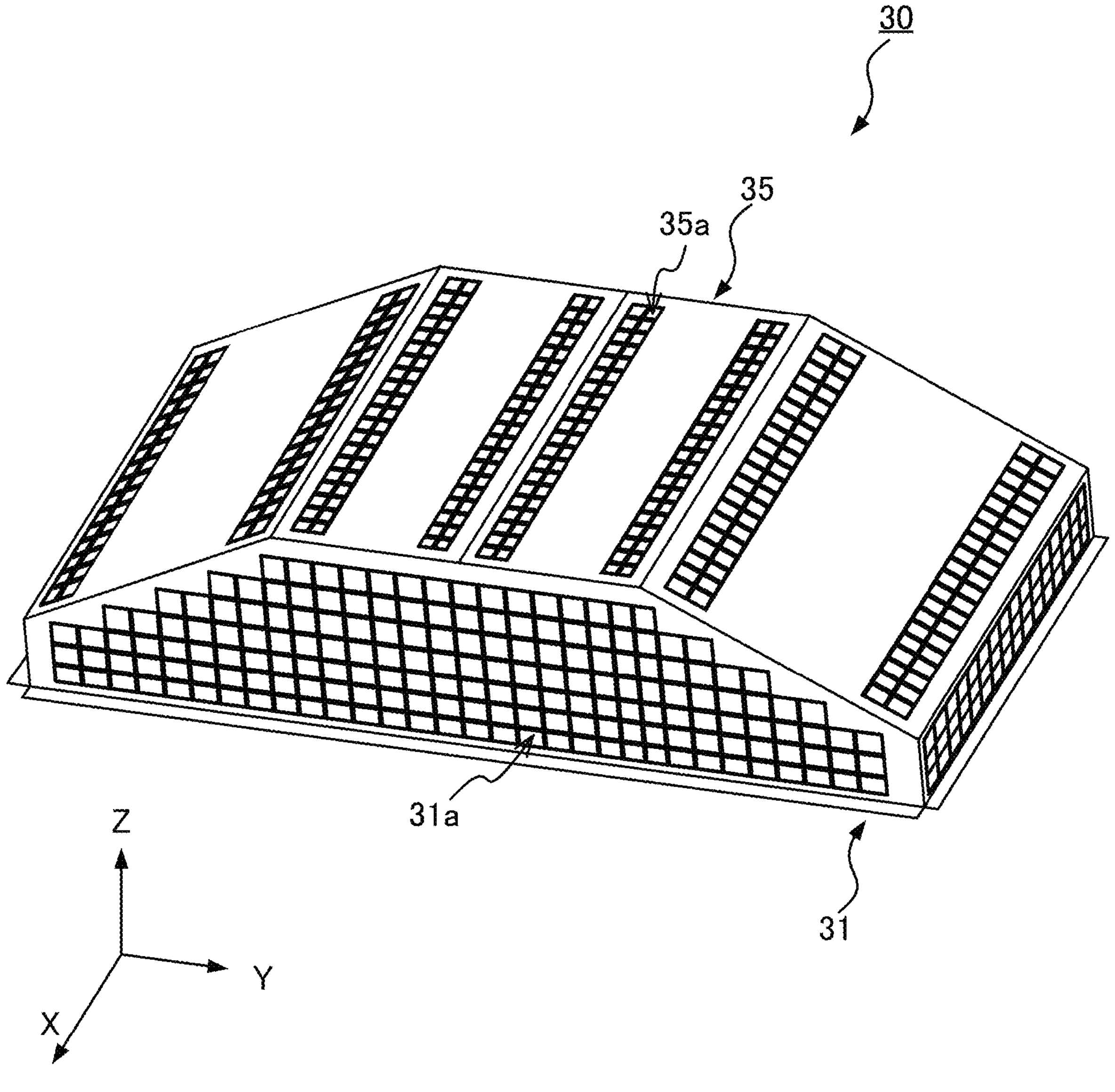
FIG. 20 is a perspective view of a cover in Embodiment 4.
Figure 21:
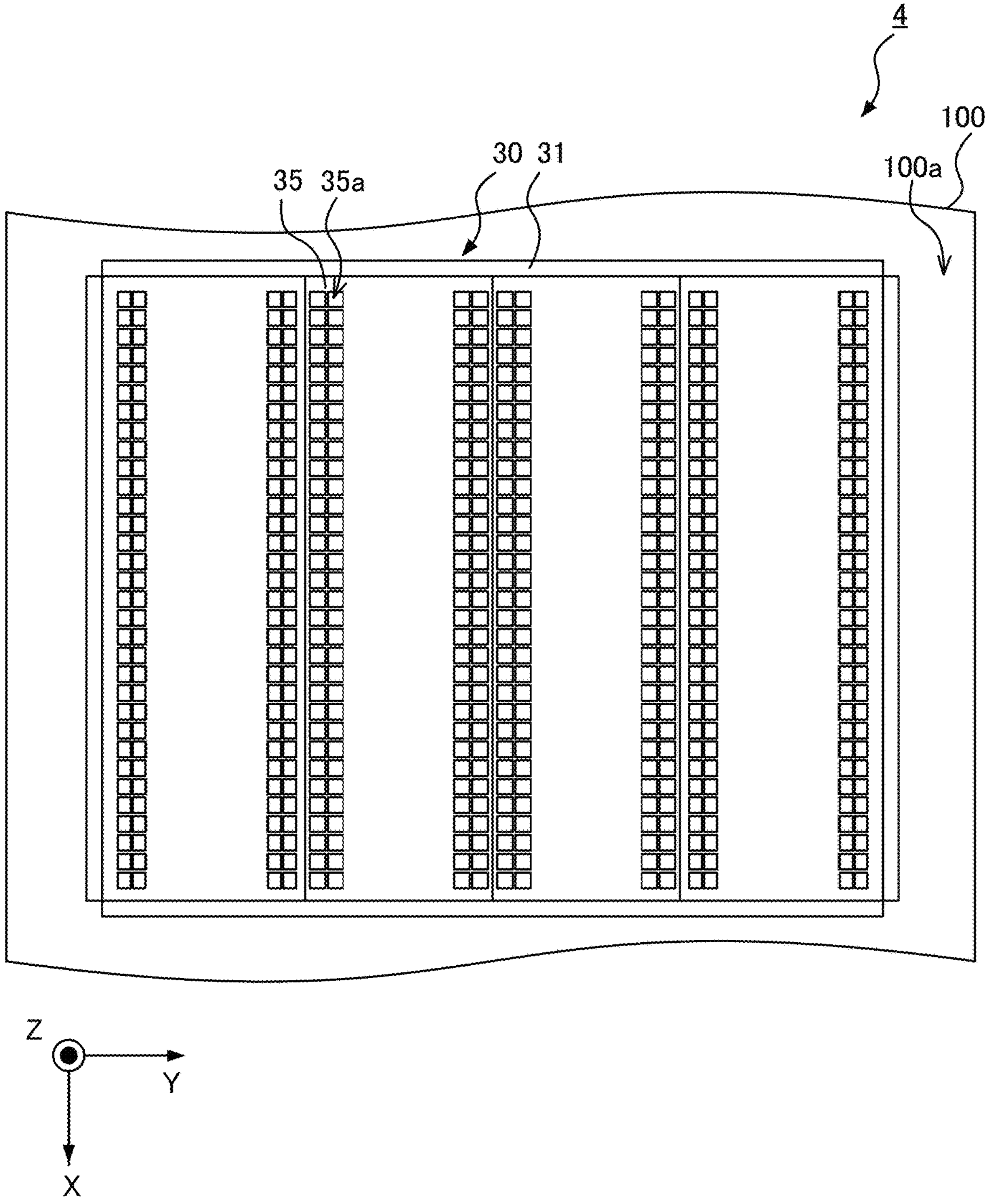
FIG. 21 is a top view of the electronic device according to Embodiment 4.

As illustrated in FIGS. 19 to 21, the outer surfaces of the lid 35 has the second vents 35*a* at or near the positions to face the second main surface 21*b* across the spaces between the fins 27. In other words, the second vents 35*a* are located to allow air moving vertically upward through the spaces between the fins 27 to flow out of the cover 30. The second vents 35*a* in the surfaces of the lid 35 have the same shape. For example, the second vents 35*a* have the same shape as the second vents 32*a* in the lid 32 of the cover 30 included in the electronic device 1 according to Embodiment 1, and are at the same intervals as the second vents 32*a* at the positions to face the second main surface 21*b* across the spaces between the fins 27.

Although the second vents 35*a* have the same shape as the second vents 32*a* and are at the same intervals from one another as the second vents 32*a*, the second vents 35*a* are located to allow air moving vertically upward through the spaces between the fins 27 to flow out of the cover 30. In other words, the lid 35 has no second vents 35*a* at positions in the lid 35 other than the above positions, for example, at positions in the lid 35 facing the middle portions of the fins 27 in Y-direction. Thus, the second vents 35*a* are fewer than the second vents 32*a* in the lid 32 of the cover 30 included in the electronic device 1 according to Embodiment 1.

Cooling of the electronic components of the electronic device 4 with the above structure is described below. The fins 27 are attached to the heat transfer members 22 with the main surfaces extending along X-axis. When the vehicle 100 is traveling, as in Embodiment 1, passing air receives heat transferred from the fins 27 and cools the electronic components, more specifically, the switching elements SW1, SW2, and SW3.

Figure 22:
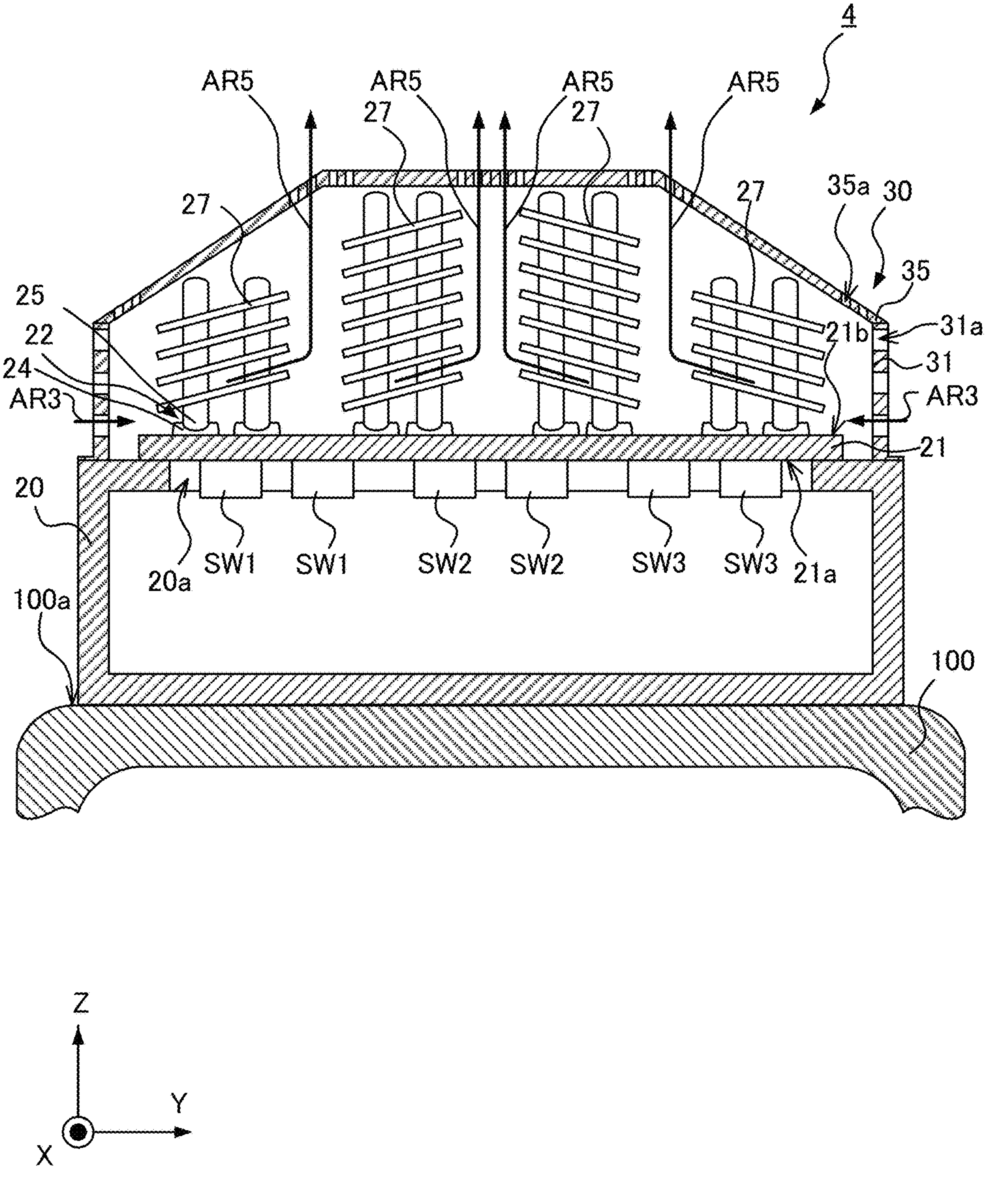
FIG. 22 is a diagram illustrating an example natural convection flow through the electronic device according to Embodiment 4.

When the vehicle 100 is stopped, no passing air occurs. Air heated with heat transferred from the fins 27 and the branch pipes 25 moves vertically upward along the main surfaces of the fins 27, as indicated by the arrows AR5 in FIG. 22, and then moves vertically upward through the spaces between the fins 27 adjacent to one another in Y-direction. The air that has moved vertically upward through the spaces between the fins 27 flows out of the cover 30 through the second vents 35*a* in the lid 35. For simplicity, FIG. 22 illustrates a portion of the airflow.

When air inside the cover 30 flows out through the second vents 35*a*, as in Embodiment 1, air outside the cover 30 flows into the cover 30 through the first vents 31*a* in the side wall 31 of the cover 30 as indicated by the arrows AR3. Although not illustrated in FIG. 22, as in Embodiment 1, air outside the cover 30 also flows into the cover 30 through the first vents 31*a* in the surfaces of the side wall 31 intersecting with Y-direction.

The air flowing into the cover 30 receives heat transferred from the fins 27 and the branch pipes 25 to be heated, moves vertically upward along the fins 27 and then vertically upward through the spaces between the fins 27, and flows out of the cover 30 through the second vents 35*a* as described above. The switching elements SW1, SW2, and SW3 can thus be cooled through such natural convection also when the vehicle 100 is stopped.

Both when the vehicle 100 is traveling and when the vehicle 100 is stopped, heat is transferred to the inner surfaces of the lid 35 by thermal radiation from the fins 27 located at the vertical upper end to cool the switching elements SW1, SW2, and SW3.

As described above, the ratio of the open areas of the second vents 35*a* to the areas of the outer surfaces of the lid 35 of the cover 30 included in the electronic device 4 according to Embodiment 4 is lower than the ratio of the open areas of the first vents 31*a* to the areas of the outer surfaces of the side wall 31. The second vents 35*a* are located to face the second main surface 21*b* across the spaces between the fins 27. The ratio of the open areas of the second vents 35*a* to the areas of the outer surfaces of the lid 35 is lower than in Embodiment 1. This structure can further lower the likelihood of reduced thermal radiation from the fins 27 resulting from exposure to sunlight. Thus, the electronic device 4 has higher cooling performance for the electronic components in sunny weather.

The fins 27 are attached to the branch pipes 25 of the heat transfer members 22 with the main surfaces inclined with respect to the horizontal plane for the vehicle 100 located horizontally. The second vents 35*a* in the lid 35 are located to face the second main surface 21*b* across the spaces between the fins 27. Thus, the air heated with heat transferred from the fins 27 and the branch pipes 25 moves vertically upward along the fins 27, moves vertically upward through the spaces between the fins 27, and flows out of the cover 30 through the second vents 35*a* in the lid 35. Air thus smoothly moves vertically upward through natural cooling. This increases cooling performance through natural cooling when the vehicle 100 is stopped.

Embodiment 5

The fins and the cover 30 may have any shapes other than in the above examples. An electronic device 5 according to Embodiment 5 includes fins and a cover 30 with shapes different from the shapes of the fins and the cover 30 in Embodiments 1 to 4, and is described focusing on the differences from Embodiments 1 to 4.

Figure 23:
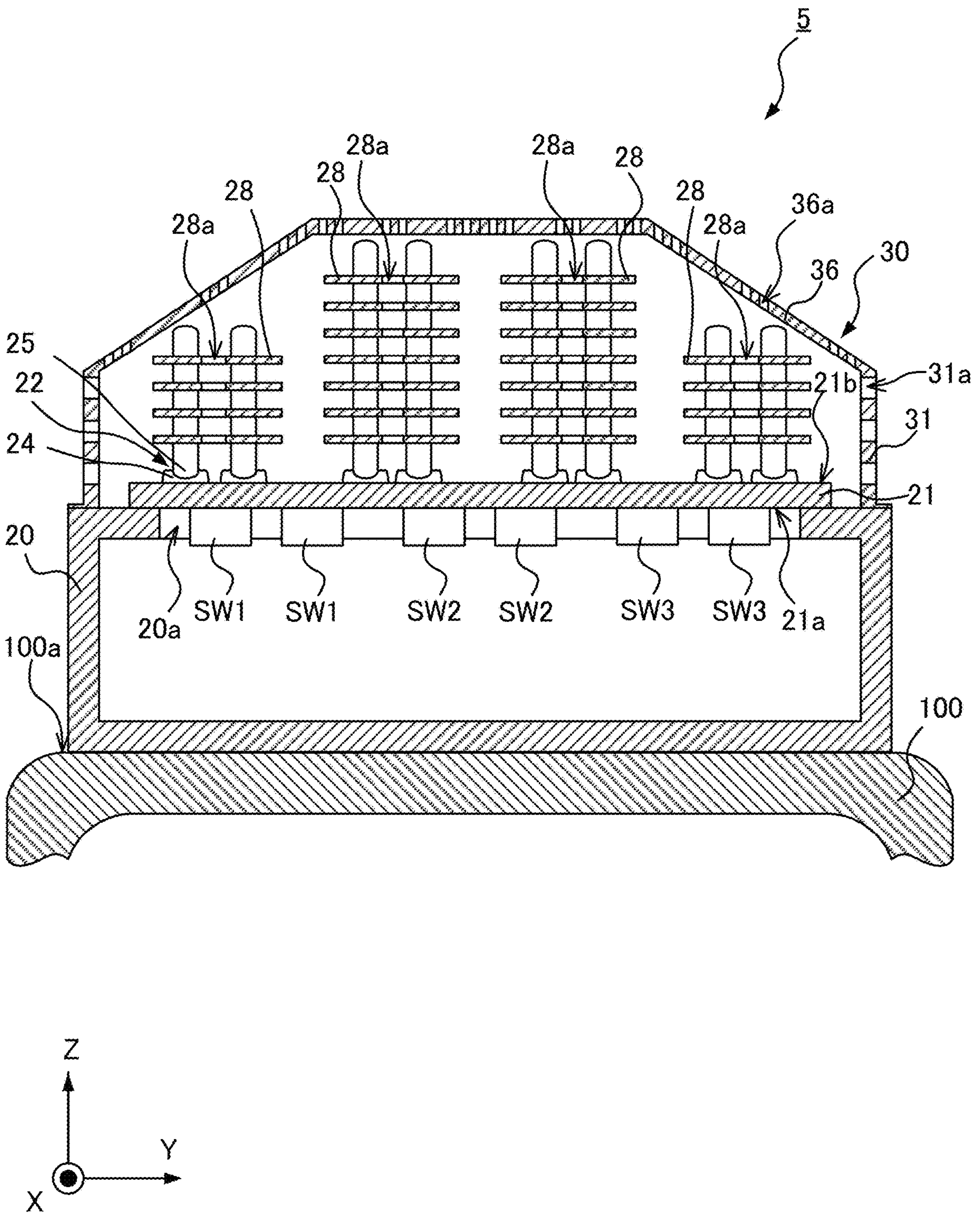
FIG. 23 is a cross-sectional view of an electronic device according to Embodiment 5.

The electronic device 5 illustrated in FIG. 23 includes multiple fins 28 having through-holes 28*a*. The fins 28 are attached to the branch pipes 25 of the heat transfer members 22 with the main surfaces substantially parallel to the second main surface 21*b*. The fins 28 have the through-holes 28*a* extending through the fins 28 away from the second main surface 21*b*.

The cover 30 included in the electronic device 5 includes the side wall 31 and a lid 36 attached to the side wall 31 with the heat transfer members 22 located between the lid 36 and the heat-receiving block 21. The cover 30 accommodates the heat-receiving block 21, the heat transfer members 22, and the fins 28 in the space surrounded by the side wall 31 and the lid 36.

The cover 30 has vents in at least the outer surfaces of the side wall 31 intersecting with X-direction. The ratio of the open areas of the vents to the areas of the outer surfaces of the side wall 31 is higher than the ratio of the open areas of the vents to the areas of the outer surfaces of the lid 36.

In Embodiment 5, as in Embodiment 1, the vents include first vents 31*a* in the outer surfaces of the side wall 31 and second vents 36*a* in the outer surfaces of the lid 36. In this case, as in Embodiment 1, the ratio of the open areas of the vents to the areas of the outer surfaces of the side wall 31 is the ratio of the sum of the open areas of the first vents 31*a* in the outer surfaces of the side wall 31 to the sum of the areas of the outer surfaces of the side wall 31. The ratio of the open areas of the vents to the areas of the outer surfaces of the lid 36 is the ratio of the sum of the open areas of the second vents 36*a* in the outer surfaces of the lid 36 to the sum of the areas of the outer surfaces of the lid 36.

Figure 24:
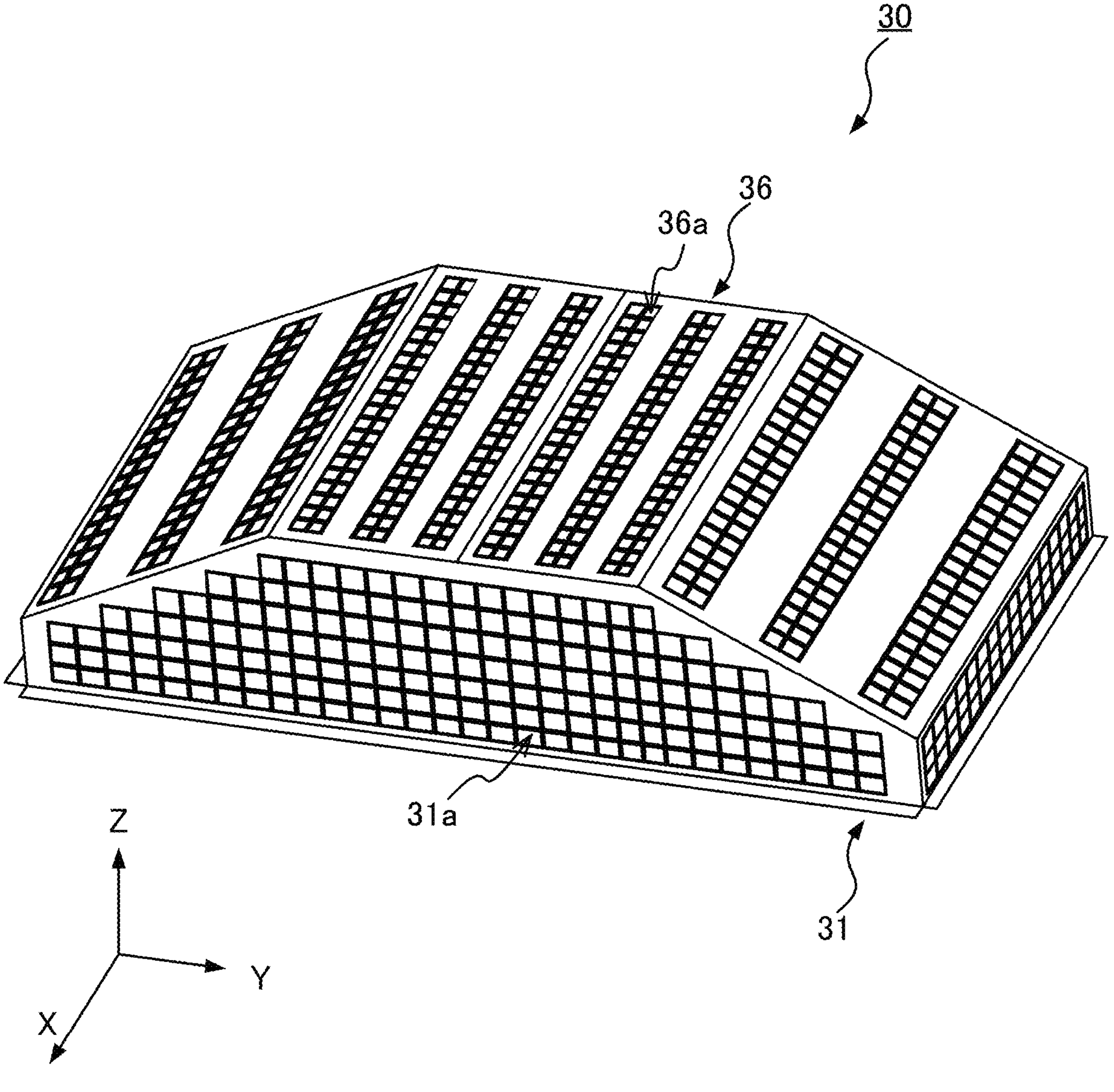
FIG. 24 is a perspective view of a cover in Embodiment 5.
Figure 25:
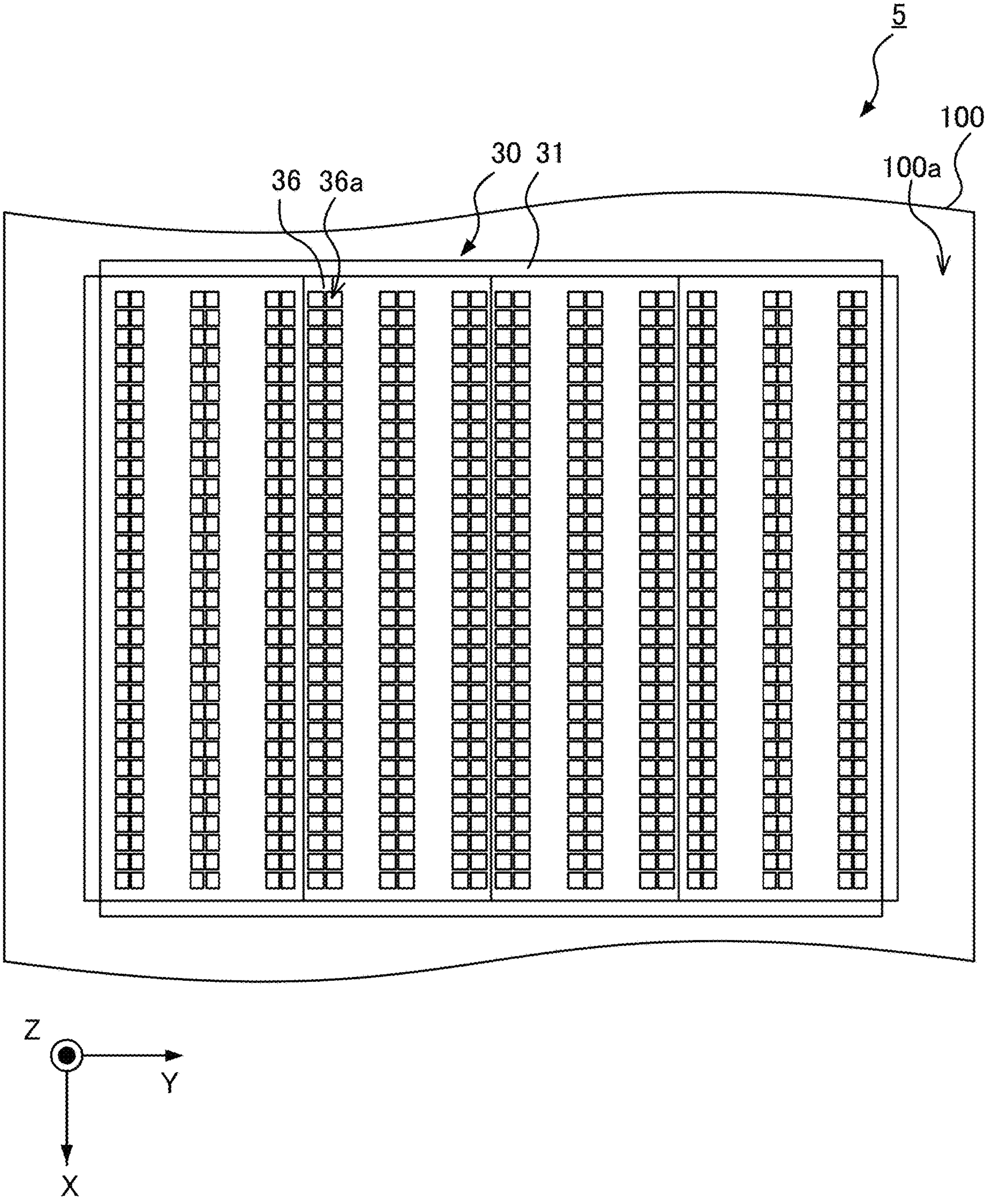
FIG. 25 is a top view of the electronic device according to Embodiment 5.

As illustrated in FIGS. 23 to 25, as in Embodiment 5, the second vents 36*a* are located in the outer surfaces of the lid 36 at or near the positions to face the second main surface 21*b* across the spaces between the fins 28 and at or near the positions to face the through-holes 28*a* in the fins 28. In other words, the second vents 36*a* are located to allow air moving vertically upward through the spaces between the fins 28 and air moving vertically upward through the through-holes 28*a* in the fins 28 to flow out of the cover 30. The second vents 36*a* in the surfaces of the lid 36 have the same shape. For example, the second vents 36*a* have the same shape as the second vents 32*a* in the lid 32 of the cover 30 included in the electronic device 1 according to Embodiment 1, and are at the same intervals as the second vents 32*a* at the positions to face the second main surface 21*b* across the spaces between the fins 28 and at the positions to face the through-holes 28*a* in the fins 28.

Although the second vents 36*a* have the same shape as the second vents 32*a*, and the second vents 36*a* adjacent to one another are at the same intervals as the second vents 32*a*, the second vents 36*a* are located to allow air moving vertically upward through the spaces between the fins 28 and air moving vertically upward through the through-holes 28*a* in the fins 28 to flow out of the cover 30. In other words, the lid 36 has no second vents 35*a* at the positions other than the above positions, for example, at positions facing the portions between the ends of the fins 28 and the through-holes 28*a*. Thus, the second vents 36*a* are fewer than the second vents 32*a* in the lid 32 of the cover 30 included in the electronic device 1 according to Embodiment 1.

Cooling of the electronic components of the electronic device 5 with the above structure is described below. When the vehicle 100 is traveling, as in Embodiment 1, passing air receives heat from the fins 28 and cools the electronic components, more specifically, the switching elements SW1, SW2, and SW3.

Figure 26:
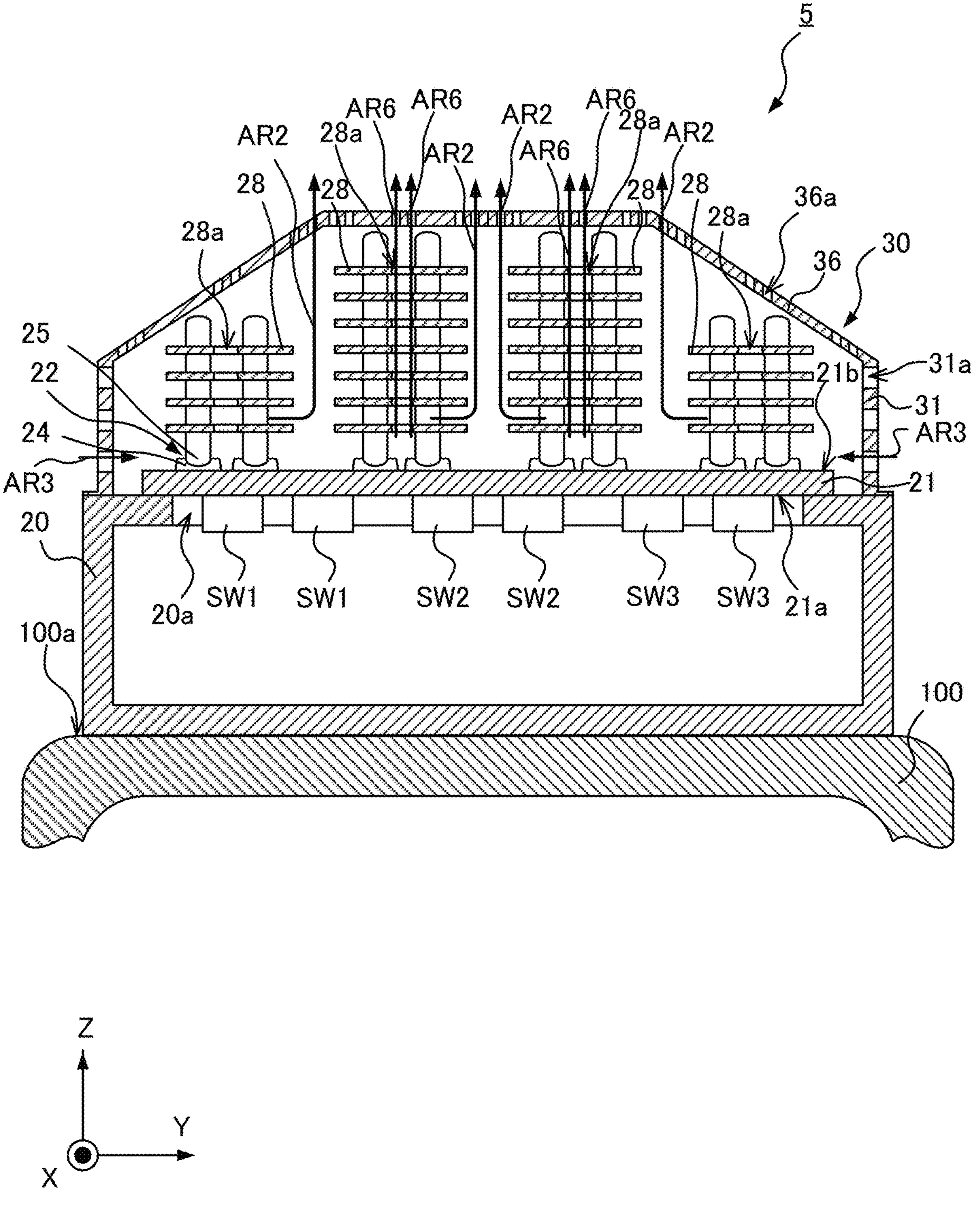
FIG. 26 is a diagram illustrating an example natural convection flow through the electronic device according to Embodiment 5.

When the vehicle 100 is stopped, no passing air occurs. As in Embodiment 1, a portion of the air heated with heat transferred from the fins 28 and the branch pipes 25 moves vertically upward through the spaces between the fins 28, as indicated by the arrows AR2 in FIG. 26. Other portions of the air heated with heat transferred from the fins 28 and the branch pipes 25 move vertically upward through the through-holes 28*a* in the fins 28, as indicated by the arrows AR6. The air that has moved vertically upward in the above manner flows out of the cover 30 through the second vents 36*a* in the lid 36. For simplicity, FIG. 26 illustrates a portion of the airflow.

When air inside the cover 30 flows out through the second vents 36*a*, as in Embodiment 1, air outside the cover 30 flows into the cover 30 through the first vents 31*a* in the side wall 31 of the cover 30 as indicated by the arrows AR3. Although not illustrated in FIG. 26, as in Embodiment 1, air outside the cover 30 also flows into the cover 30 through the first vents 31*a* in the surfaces of the side wall 31 intersecting with Y-direction.

The air flowing into the cover 30 receives heat transferred from the fins 28 and the branch pipes 25 to be heated, moves vertically upward through the spaces between the fins 28 or the through-holes 28*a* in the fins 28 as described above, and flows out of the cover 30 through the second vents 36*a*. The switching elements SW1, SW2, and SW3 can thus be cooled through such natural convection also when the vehicle 100 is stopped.

Both when the vehicle 100 is traveling and when the vehicle 100 is stopped, heat is transferred to the inner surfaces of the lid 36 by thermal radiation from the fins 28 located at the vertical upper end to cool the switching elements SW1, SW2, and SW3.

As described above, the ratio of the open areas of the second vents 36*a* to the areas of the outer surfaces of the lid 36 of the cover 30 included in the electronic device 5 according to Embodiment 5 is lower than the ratio of the open areas of the first vents 31*a* to the areas of the outer surfaces of the side wall 31. The second vents 35*a* are located to face the second main surface 21*b* across the spaces between the fins 28 and to face the through-holes 28*a* in the fins 28. Thus, the ratio of the open areas of the second vents 36*a* to the areas of the outer surfaces of the lid 36 is lower than in Embodiment 1. The structure can further lower the likelihood of reduced thermal radiation from the fins 28 resulting from exposure to sunlight. Thus, the electronic device 5 has higher cooling performance for the electronic components in sunny weather.

The fins 28 have the through-holes 28*a*, and the second vents 36*a* in the lid 36 are located to face the second main surface 21*b* across the spaces between the fins 28 and to face the through-holes 28*a*. Thus, air heated with heat transferred from the fins 28 and the branch pipes 25 moves vertically upward through the spaces between the fins 28 and through the through-holes 28*a* in the fins 28, and flows out of the cover 30 through the second vents 36*a* in the lid 36. Air thus smoothly moves vertically upward through natural cooling. This increases cooling performance through natural cooling when the vehicle 100 is stopped.

Embodiment 6

The cover 30 may have any shape other than in the above examples. An electronic device 6 according to Embodiment 6 includes a cover 30 with a shape different from the shape of the cover 30 in Embodiments 1 to 5, and is described focusing on the differences from Embodiments 1 to 5.

Figure 27:
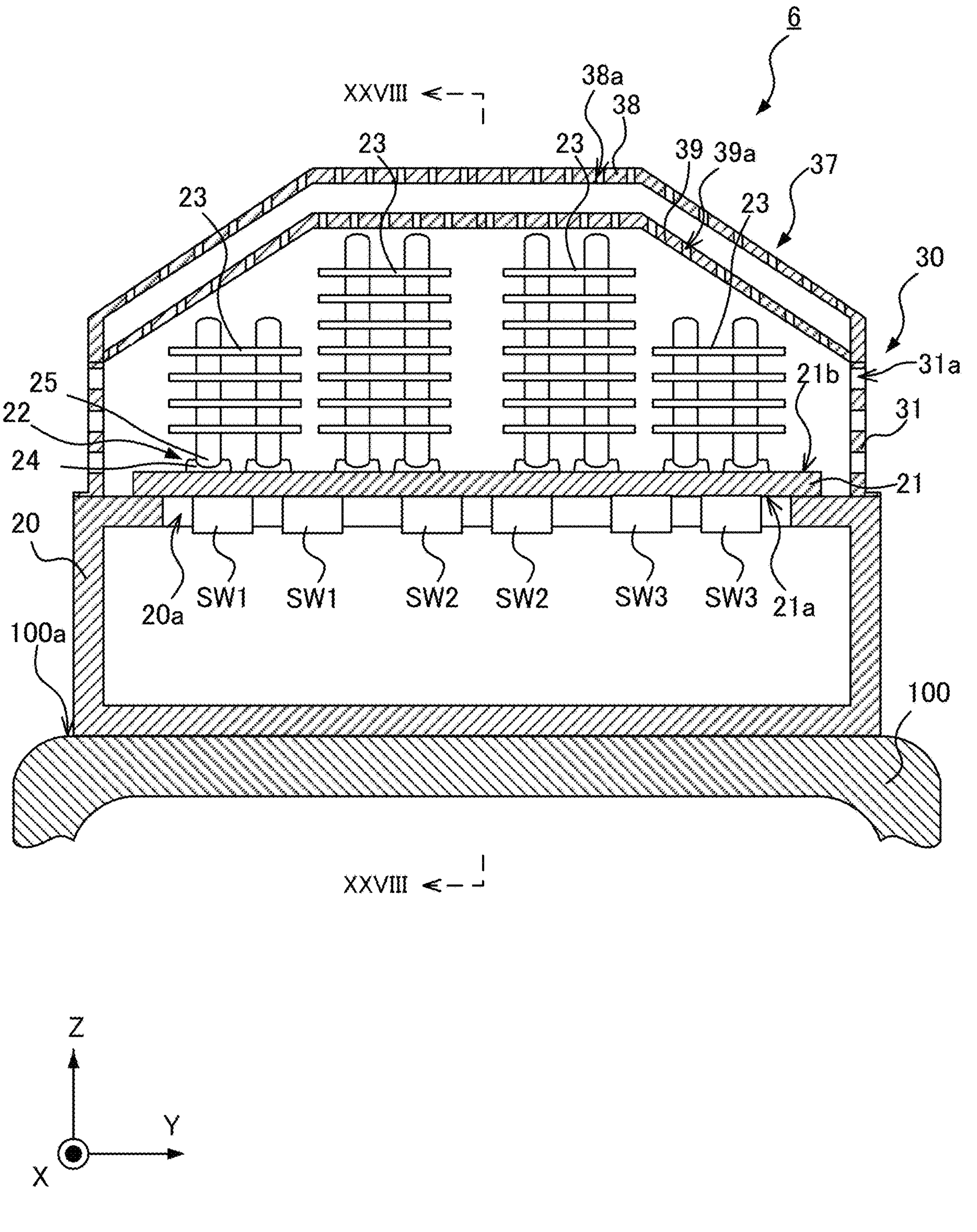
FIG. 27 is a cross-sectional view of an electronic device according to Embodiment 6.

The electronic device 6 illustrated in FIG. 27 includes a cover 30 including the side wall 31 and a lid 37 having a multilayer structure. The lid 37 is attached to the side wall 31 with the heat transfer members 22 located between the lid 37 and the heat-receiving block 21. The cover 30 accommodates the heat-receiving block 21, the heat transfer members 22, and the fins 23 in the space surrounded by the side wall 31 and the lid 37.

The lid 37 includes an outer lid 38 and an inner lid 39 located closer to the heat-receiving block 21 than the outer lid 38.

The cover 30 has vents in at least the outer surfaces of the side wall 31 intersecting with X-direction. The ratio of the open areas of the vents to the areas of the outer surfaces of the side wall 31 is higher than the ratio of the open areas of the vents to the areas of the outer surfaces of the lid 37.

In Embodiment 6, the vents include first vents 31*a* in outer surfaces of the side wall 31 as in Embodiment 1, second vents 38*a* in outer surfaces of the outer lid 38, and second vents 39*a* in outer surfaces of the inner lid 39. As in Embodiment 1, the ratio of the open areas of the vents to the areas of the outer surfaces of the side wall 31 is the ratio of the sum of the open areas of the first vents 31*a* in the outer surfaces of the side wall 31 to the sum of the areas of the outer surfaces of the side wall 31. The ratio of the open areas of the vents to the areas of the outer surfaces of the lid 37 is the ratio of the sum of the open areas of the second vents 38*a* in the outer surfaces of the outer lid 38 to the sum of the areas of the outer surfaces of the outer lid 38, and the ratio of the sum of the open areas of the second vents 39*a* in the outer surfaces of the inner lid 39 to the sum of the areas of the outer surfaces of the inner lid 39. The outer surfaces of the inner lid 39 are surfaces of the inner lid 39 opposite to the heat-receiving block 21.

In Embodiment 6, the ratio of the open areas of the first vents 31*a* to the areas of the outer surfaces of the side wall 31 is higher than the ratio of the open areas of the second vents 38*a* to the areas of the outer surfaces of the outer lid 38 and higher than the ratio of the open areas of the second vents 39*a* to the areas of the outer surfaces of the inner lid 39.

Figure 28:
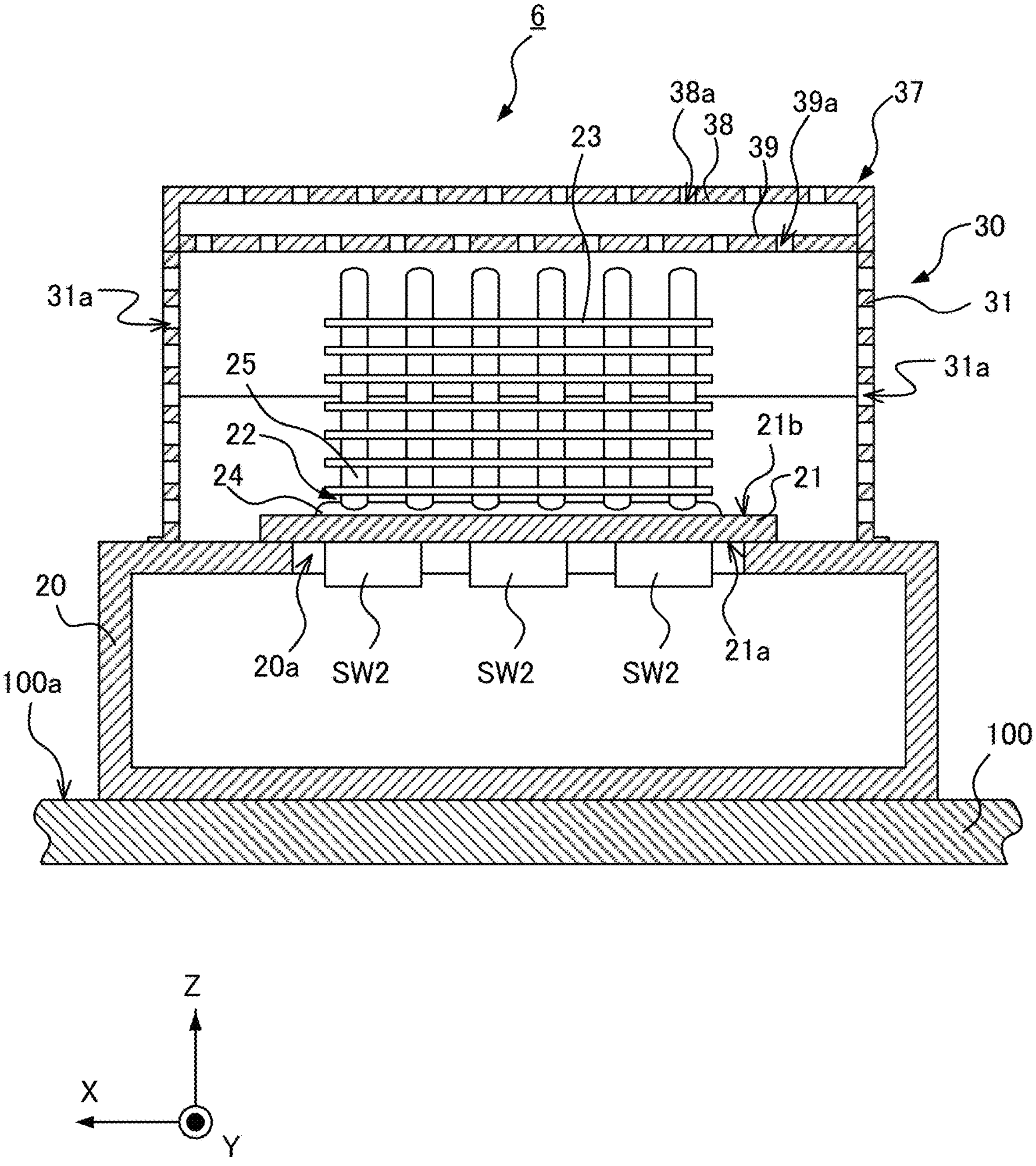
FIG. 28 is a cross-sectional view of the electronic device according to Embodiment 6 taken along line XXVIII-XXVIII in FIG. 27 as viewed in the direction indicated by the arrows.

As illustrated in FIG. 27 and FIG. 28 that is a cross-sectional view taken along line XXVIII-XXVIII in FIG. 27 as viewed in the direction indicated by the arrows, the second vents 38*a* in the outer lid 38 and the second vents 39*a* in the inner lid 39 are staggered from each other, or in other words, located without the openings facing each other. More specifically, the second vents 38*a* in the outer lid 38 face the portions of the inner lid 39 having no second vents 39*a*, or in other words, the portions of the inner lid 39 between the second vents 39*a*. Similarly, the second vents 39*a* in the inner lid 39 face the portions of the outer lid 38 having no second vents 38*a*, or in other words, the portions of the outer lid 38 between the second vents 38*a*.

For example, as in Embodiment 2, the outer lid 38 has substantially square second vents 38*a* with a length d2 on each side at intervals g2. The inner lid 39 has substantially square second vents 39*a* with a length d2 on each side at intervals g2 at positions not to face the second vents 38*a*.

A part of sunlight is thus blocked by the outer lid 38, and another part of sunlight that has passed through the second vents 38*a* in the outer lid 38 is blocked by the inner lid 39. This structure can thus lower the likelihood of reduced thermal radiation from the fins 23 resulting from exposure to sunlight.

Cooling of the electronic components of the electronic device 6 with the above structure is described below. When the vehicle 100 is traveling, as in Embodiment 1, passing air receives heat from the fins 23 and cools the electronic components, more specifically, the switching elements SW1, SW2, and SW3.

Figure 29:
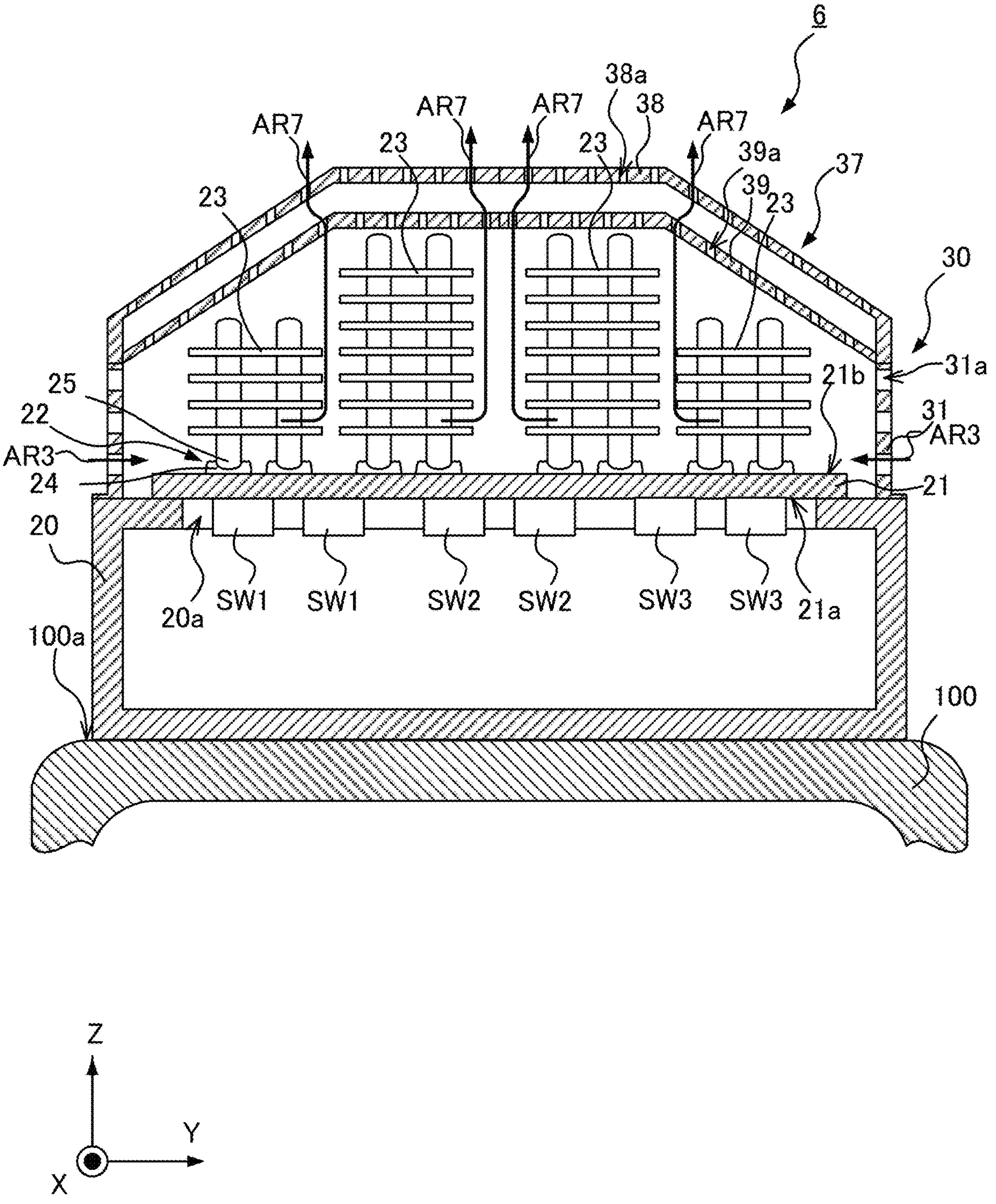
FIG. 29 is a diagram illustrating an example natural convection flow through the electronic device according to Embodiment 6.
Figure 30:
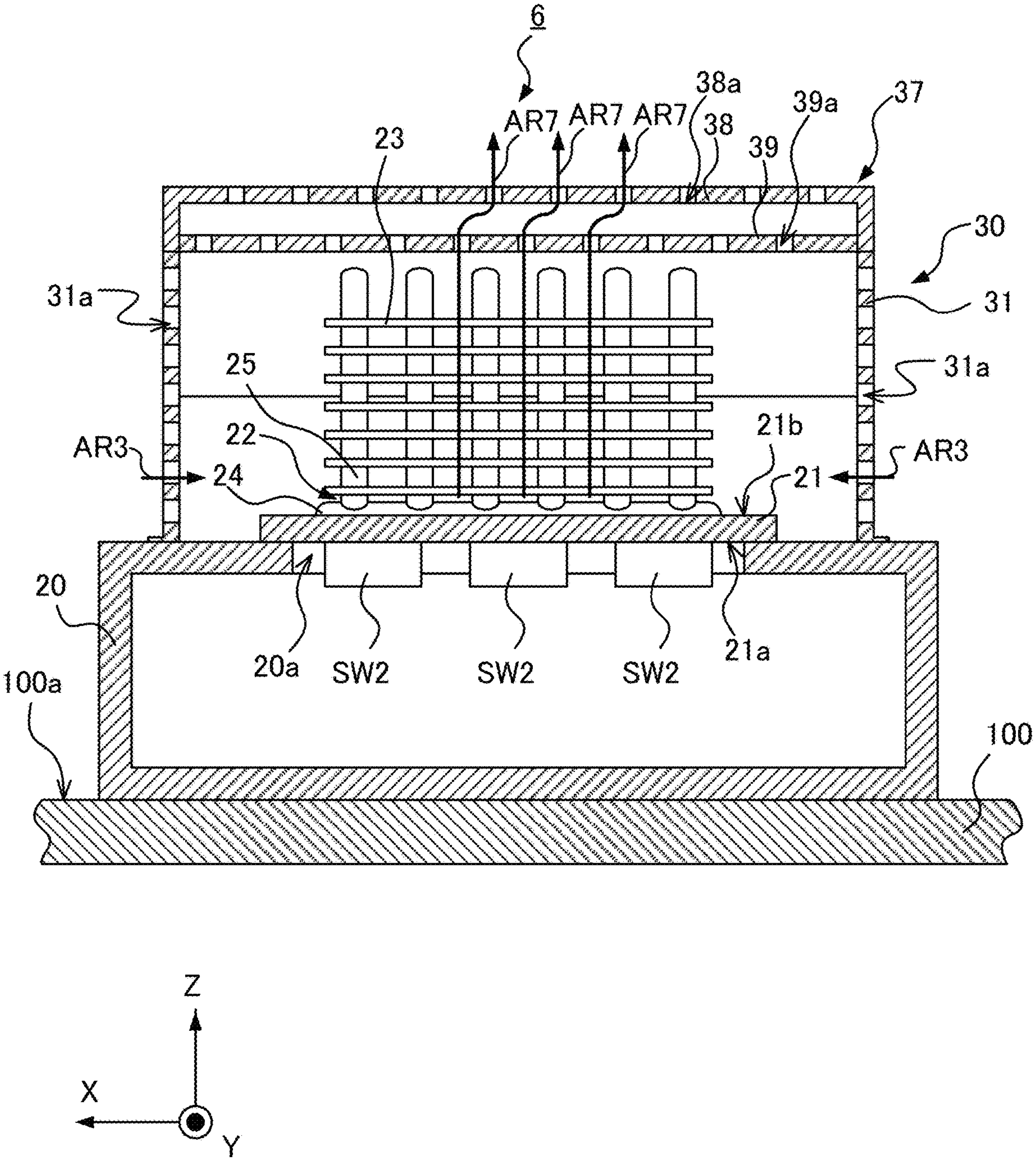
FIG. 30 is a diagram illustrating an example natural convection flow through the electronic device according to Embodiment 6.

When the vehicle 100 is stopped, no passing air occurs. Air heated with heat transferred from the fins 23 and the branch pipes 25 moves vertically upward through the spaces between the fins 23, as indicated by the arrows AR7 in FIGS. 29 and 30. The air that has moved vertically upward flows out of the cover 30 through the second vents 39*a* in the inner lid 39 and then through the second vents 38*a* in the outer lid 38. For simplicity, FIGS. 29 and 30 simply illustrate a portion of airflow.

When the air inside the cover 30 flows out sequentially through the second vents 39*a* and 38*a*, as in Embodiment 1, air outside the cover 30 also flows into the cover 30 through the first vents 31*a* in the side wall 31 of the cover 30 as indicated by the arrows AR3.

The air flowing into the cover 30 receives heat transferred from the fins 23 and the branch pipes 25 to be heated, moves vertically upward through the spaces between the fins 23 as described above, and flows out of the cover 30 sequentially through the second vents 39*a* and 38*a*. The switching elements SW1, SW2, and SW3 can thus be cooled through such natural convection also when the vehicle 100 is stopped.

Both when the vehicle 100 is traveling and when the vehicle 100 is stopped, heat is transferred to the inner surfaces of the lid 37, more specifically, the inner surfaces of the inner lid 39, by thermal radiation from the fins 23 located at the vertical upper end to cool the switching elements SW1, SW2, and SW3. The inner surfaces of the inner lid 39 are surfaces of the inner lid 39 adjacent to the heat-receiving block 21.

As described above, the cover 30 included in the electronic device 6 according to Embodiment 6 has the ratio of the open areas of the first vents 31*a* to the areas of the outer surfaces of the side wall 31 higher than the ratio of the open areas of the second vents 38*a* to the areas of the outer surfaces of the outer lid 38 and higher than the ratio of the open areas of the second vents 39*a* to the areas of the outer surfaces of the inner lid 39. In other words, the ratio of the open areas of the second vents 38*a* to the areas of the outer surfaces of the outer lid 38 and the ratio of the open areas of the second vents 39*a* to the areas of the outer surfaces of the inner lid 39 are lower than the ratio of the open areas of the first vents 31*a* to the areas of the outer surfaces of the side wall 31. The second vents 38*a* in the outer lid 38 and the second vents 39*a* in the inner lid 39 are staggered from each other.

As described above, the cover 30 includes the outer lid 38 and the inner lid 39 having vents staggered from each other. The electronic device 6 can lower the likelihood of reduced thermal radiation from the fins 23 resulting from exposure to sunlight more effectively than an electronic device including many vents, such as the first vents 31*a*, located uniformly across the full portion of the cover. Sunlight that has passed through the second vents 38*a* in the outer lid 38 is blocked by the inner lid 39. This structure can thus further lower the likelihood of reduced thermal radiation from the fins 23 resulting from exposure to sunlight than the structure in Embodiment 1. Thus, the electronic device 6 has higher cooling performance for the electronic components in sunny weather.

Figure 31:
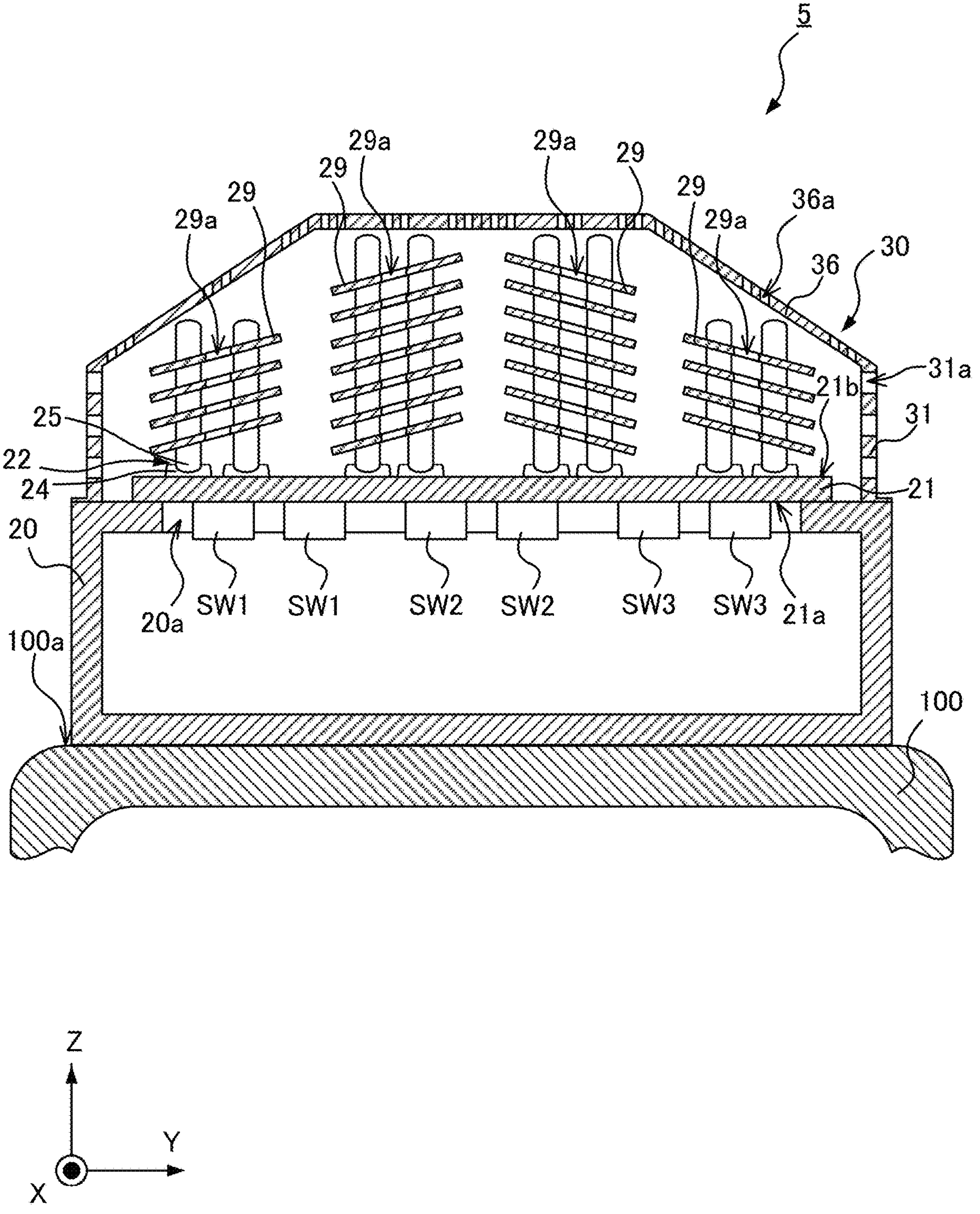
FIG. 31 is a diagram of an electronic device according to a modification of an embodiment.

Embodiments of the present disclosure are not limited to the embodiments described above. Some of the embodiments may be combined as appropriate. For example, as illustrated in FIG. 31, the electronic device 5 may include fins 29 attached to the branch pipes 25 of the heat transfer members 22 with the main surfaces inclined with respect to the second main surface 21*b* and having through-holes 29*a* extending away from the second main surface 21*b*.

Any number of first vents 31*a* and any number of second vents 32*a*, 33*a*, 35*a*, 36*a*, 38*a*, and 39*a* may be arranged in a manner other than in the above examples in a shape or a size other than in the above examples. Any number of first vents 31*a* and any number of second vents 32*a*, 33*a*, 35*a*, and 36*a* in any shape or size may be arranged at any interval in any manner to have the ratio of the open areas of the first vents 31*a* to the areas of the outer surfaces of the side wall 31 higher than the ratio of the open areas of the second vents 32*a*, 33*a*, 35*a*, and 36*a* to the areas of the outer surfaces of the lids 32, 33, 35, and 36. Similarly, any number of first vents 31*a* and any number of second vents 38*a* and 39*a* in any shape or size may be arranged at any interval in any manner to have the ratio of the open areas of the first vents 31*a* to the areas of the outer surfaces of the side wall 31 higher than the ratio of the open areas of the second vents 38*a* to the areas of the outer surfaces of the outer lid 38 and higher than the ratio of the open areas of the second vents 39*a* to the areas of the outer surfaces of the inner lid 39.

For example, the first vents 31*a* and the second vents 32*a*, 33*a*, 35*a*, 36*a*, 38*a*, and 39*a* may be, for example, rectangular, circular, or elliptic, rather than square.

The inverter 14 may supply power to any load, other than the air-conditioner 62, that operates when the vehicle 100 is stopped. In an example, the inverter 14 can supply power to a light equipment or a door opening and closing device in the vehicle 100.

The housing 20 may have any shape that can accommodate electronic components including the switching elements SW1, SW2, and SW3 and that is attachable to the roof 100*a*. In an example, the vertically upper surface of the housing 20 may be inclined with respect to the horizontal plane for the vehicle 100 located horizontally.

The heat-receiving block 21 may be a plate having a curved surface protruding away from the housing 20. As described in the above embodiments, the heat-receiving block 21 may be a single plate or a combination of multiple plates.

Electronic components attached to the heat-receiving block 21 may be, for example, any electronic components, other than the switching elements SW1, SW2, and SW3, that are accommodated in the housing 20 such as a thyristor or a diode.

The heat transfer members 22 may not be heat pipes but may be formed of any material that transfers heat away from the second main surface 21*b*. For example, the heat transfer members 22 may be rod-like members formed of a highly thermally conductive material including metal such as iron or aluminum.

The heat transfer members 22 may be arranged in any manner other than in the above examples to cool electronic components with passing air and through natural convection. More specifically, the branch pipes 25 of the heat transfer members 22 extending in the positive Z-direction in the above embodiment may extend in a direction inclined with respect to Z-axis.

The headers 24 and the branch pipes 25 may have any shape other than in the above examples to transfer heat away from the second main surface 21*b*. In an example, the header 24 and the branch pipe 25 may be integral with each other and may be a U-shaped or L-shaped heat pipe as the heat transfer member 22.

When taken perpendicular to the extension direction, each heat transfer member 22 may have an elongated circular cross section rather than a circular cross section. The elongated circular shape is acquired by deforming a circle to narrow a part of the dimension, and includes an ellipse, a streamline shape, and an oval. The oval refers to an outline of perimeters of two circles with the same diameter connected with two straight lines.

The fins 23, 26, 27, 28, and 29 may be formed of the same material, or at least one of the fins 23, 26, 27, 28, or 29 may be formed of a material different from the material of the other fins 23, 26, 27, 28, and 29. When at least one of the fins 23, 27, 28, and 29 is formed of a material different from the material of the other fins 23, 26, 27, 28, and 29, at least one of the fins 23, 26, 27, 28, and 29 has thermal conductivity different from the thermal conductivity of the other fins 23, 26, 27, 28, and 29.

For example, the fins 23, 26, 27, 28, and 29 located vertically upward may have higher thermal conductivity than the fins 23, 26, 27, 28, and 29 located vertically downward. For example, the fins 23, 26, 27, 28, and 29 located vertically upward may be formed of copper, and the fins 23, 26, 27, 28, and 29 located vertically downward may be formed of aluminum.

When other devices are located around the electronic devices 1 to 6, the fins 23, 26, 27, 28, and 29 located vertically upward can more easily come in contact with air flowing from the outside than the fins 23, 26, 27, 28, and 29 located vertically downward. The fins 23, 26, 27, 28, and 29 located vertically upward having higher thermal conductivity than the other fins 23, 26, 27, 28, and 29 can thus increase the cooling performance of the electronic devices 1 to 6.

Any number of fins 23, 26, 27, 28, and 29 in any shape may be arranged in any manner other than in the above examples. For example, the fins 23, 26, 27, 28, and 29 may be plates with curved surfaces. In another example, the fins 23, 26, 27, 28, and 29 may have different shapes from each other.

The cover 30 may have any shape that covers the heat transfer members 22 and the fin 23, 26, 27, 28, or 29 and allows air to flow inside. In an example, the lid 32, 33, 34, 35, 36, or 37 of the cover 30 may have a curved surface. The cover 30 preferably has a shape that maximizes the inside space within the vehicle limit.

Figure 32:
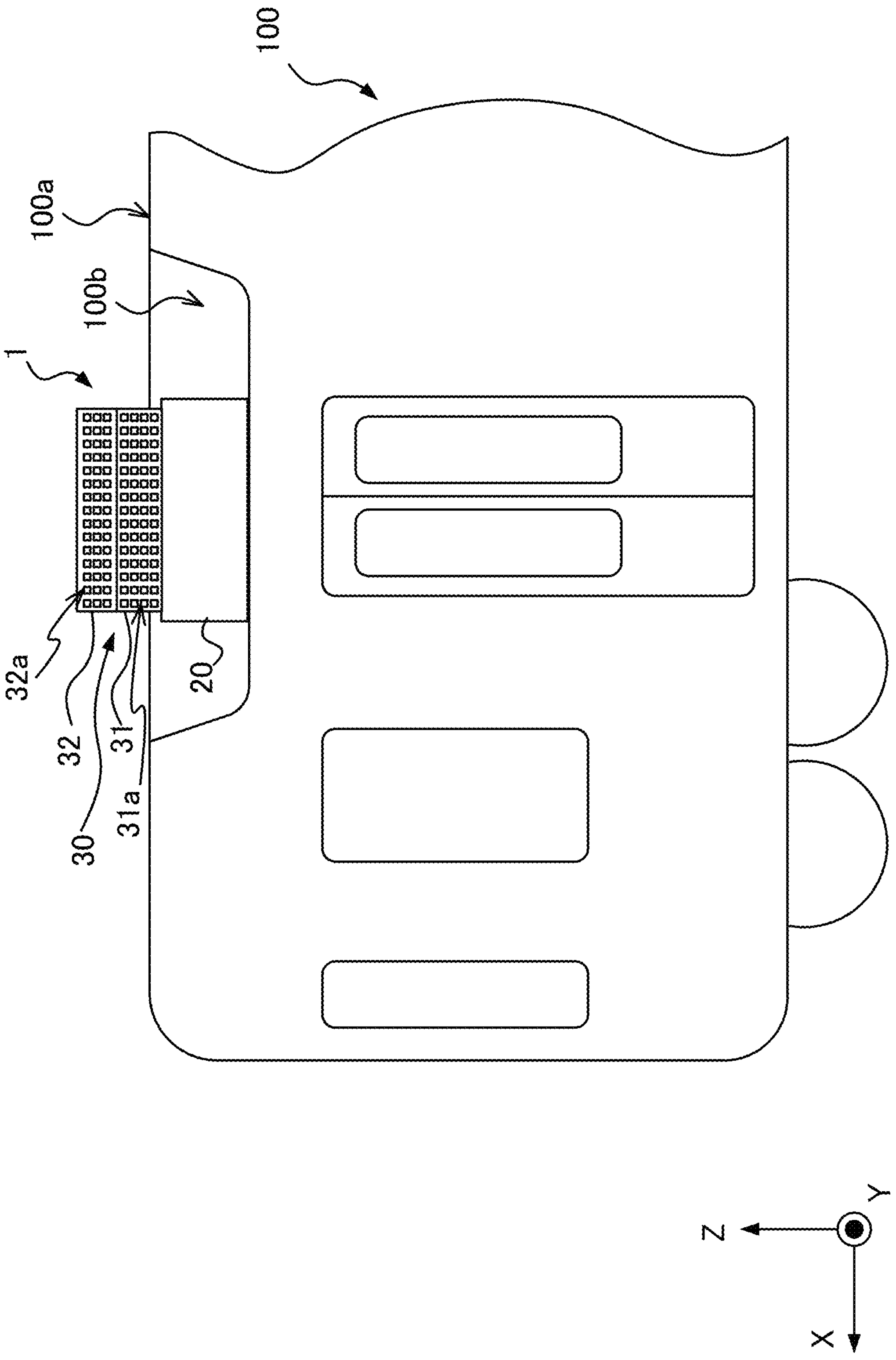
FIG. 32 is a diagram of the electronic device the embodiment, mounted on a vehicle in another example manner.

Each of the electronic devices 1 to 6 may be received in a recess on the roof 100*a* of the vehicle 100. FIG. 32 illustrates an example of the electronic device 1 received in a recess. As illustrated in FIG. 32, the roof 100*a* of the vehicle 100 includes a container 100*b* being a recess that is open vertically upward. The electronic device 1 may be received in the container 100*b*. A part of the fins 23, 26, 27, 28, and 29 are preferably located higher than the vertically upper end of the container 100*b*.

Each of the electronic devices 1 to 6 may be any electronic device installable on the vehicle 100 and including heat-generating electronic components, rather than the power converter illustrated in FIG. 1. In an example, each of the electronic devices 1 to 6 may be a heat exchanger in an air-conditioner.

In the above embodiments, each of the electronic devices 1 to 6 cools the electronic components with passing air. The electronic devices 1 to 6 may cool electronic components with air supplied from external devices rather than with the passing air. In an example, the electronic devices 1 to 6 may each cool the electronic components with air supplied from a fan located adjacent to the electronic devices 1 to 6.

The electronic devices 1 to 6 is installable on a DC feeding railway vehicle, rather than on an AC feeding railway vehicle. The electronic devices 1 to 6 are installable on any vehicle that creates passing air such as a trolley bus or a streetcar, rather than the railway vehicle.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1, 2, 3, 4, 5, 6 Electronic device
1*a*, 1*b* Terminal
11, 15 Transformer
12 Converter
13, 14 Inverter
20 Housing
20*a* Opening
21 Heat-receiving block
21*a* First main surface
21*b* Second main surface
22 Heat transfer member
23, 26, 27, 28, 29 Fin
24 Header
25 Branch pipe
28*a*, 29*a* Through-hole
30 Cover
31 Side wall
31*a* First vent
32, 33, 34, 35, 36, 37 Lid
32*a*, 33*a*, 35*a*, 36*a*, 38*a*, 39*a* Second vent
38 Outer lid
39 Inner lid
61 Motor
62 Air-conditioner
100 Vehicle
100*a* Roof
100*b* Container
AR1, AR2, AR3, AR4, AR5, AR6, AR7 Arrow
C1 Capacitor
d1, d2 Length
g1, g2 Interval
SW1, SW2, SW3 Switching element

The invention claimed is:

1. An electronic device, comprising:

a heat-receiving block being heat conductive, the heat-receiving block having a first main surface to which an electronic component is attached;

a heat transfer member attached to the heat-receiving block, the heat transfer member extending away from a second main surface of the heat-receiving block located opposite to the first main surface of the heat-receiving block and facing vertically upward, the heat transfer member being configured to transfer heat transferred from the electronic component through the heat-receiving block away from the second main surface;

a plurality of fins attached to the heat transfer member, the plurality of fins being configured to dissipate heat transferred from the electronic component through the heat-receiving block and the heat transfer member into ambient air, the plurality of fins being arranged in at least one of a width direction of a vehicle or a travel direction of the vehicle with spaces between the plurality of fins; and a cover including a side wall and a lid, the side wall extending in a direction surrounding a normal line to the second main surface, the lid being attached to the side wall with the heat transfer member located between the lid and the heat-receiving block, the cover accommodating the heat transfer member and the plurality of fins in a space surrounded by the side wall and the lid, wherein the cover has a plurality of first vents in at least an outer surface of the side wall intersecting with the travel direction of the vehicle, the lid has an outer surface having a plurality of second vents therein, and a ratio of a sum of open areas of the plurality of first vents on the side wall to an area of the outer surface of the side wall is higher than a ratio of a sum of open areas of the plurality of second vents on the lid to an area of the outer surface of the lid.

2. The electronic device according to claim 1, further comprising:

a housing accommodating the electronic component, having an opening in a vertically upper portion of the housing, and installable on a roof of the vehicle, wherein the heat-receiving block is attached to the housing with the first main surface closing the opening of the housing.

3. The electronic device according to claim 1, wherein the open area of each of the plurality of first vents is larger than the open area of each of the plurality of second vents.

4. The electronic device according to claim 1, wherein adjacent first vents of the plurality of first vents are at a smaller interval than adjacent second vents of the plurality of second vents.

5. The electronic device according to claim 1, wherein the lid has the plurality of second vents at a position facing the second main surface across the spaces between the plurality of fins.

6. The electronic device according to claim 1, wherein each of the plurality of fins has a through-hole extending therethrough away from the second main surface, and the lid has the plurality of second vents at a position facing the through-hole.

7. The electronic device according to claim 1, wherein the lid includes an outer lid and an inner lid located closer to the heat-receiving block than the outer lid, one or more of the plurality of second vents are in the outer lid, one or more of the plurality of second vents are in the inner lid, and the one or more of the plurality of the second vents in the outer lid and the one or more of the plurality of the second vents in the inner lid are staggered from each other.

* * * * *